United States Patent [19]
Tsugaru

[11] Patent Number: 5,926,040
[45] Date of Patent: Jul. 20, 1999

[54] LOGIC CIRCUIT

[75] Inventor: Kazunori Tsugaru, Yokohama, Japan

[73] Assignee: Kabushiki Kaisha Toshiba, Kawasaki, Japan

[21] Appl. No.: 08/819,394

[22] Filed: Mar. 17, 1997

[30] Foreign Application Priority Data

Mar. 15, 1996 [JP] Japan ................................ 8-087719

[51] Int. Cl.[6] .............................................. H03K 19/086
[52] U.S. Cl. ............................................. 326/126; 326/18
[58] Field of Search ........................... 326/18, 126, 127, 326/31, 32, 33; 327/65, 66, 77

[56] References Cited

U.S. PATENT DOCUMENTS

| | | | |
|---|---|---|---|
| 5,381,057 | 1/1995 | Kuroda et al. | 326/126 |
| 5,473,272 | 12/1995 | Wilhelm et al. | |
| 5,539,350 | 7/1996 | Wilhelm | |
| 5,781,035 | 7/1998 | Tashibu | 326/126 |

FOREIGN PATENT DOCUMENTS

| | | |
|---|---|---|
| 7-38403 | 2/1995 | Japan . |
| 7-58617 | 3/1995 | Japan . |
| 7-142991 | 6/1995 | Japan . |

OTHER PUBLICATIONS

Sedra et al. *Microelectronic Circuits* pp. 578–581, 1987.

*Primary Examiner*—Jon Santamauro
*Attorney, Agent, or Firm*—Oblon, Spivak, McClelland, Maier & Neustadt, P.C.

[57] ABSTRACT

An Emitter Coupled Logic (ECL) circuit includes therein a constant potential generating circuit which is comprised of a load resistor, an active pull-down transistor and a constant current source. By containing the constant potential generating circuit which has been independently provided externally to an ECL circuit, the ECL logic circuit is operable at the power supply potential of −4.5 V or −5.2 V at the high speed with reduced power supply consumption. The constant current source is an NPN transistor whose base is connected to an output node of a bias circuit, and the output of the bias circuit is an output having a value set so that a collector current of the active pull-down transistor is kept constant at all times. Hence, the electric power consumption can be further reduced.

13 Claims, 17 Drawing Sheets

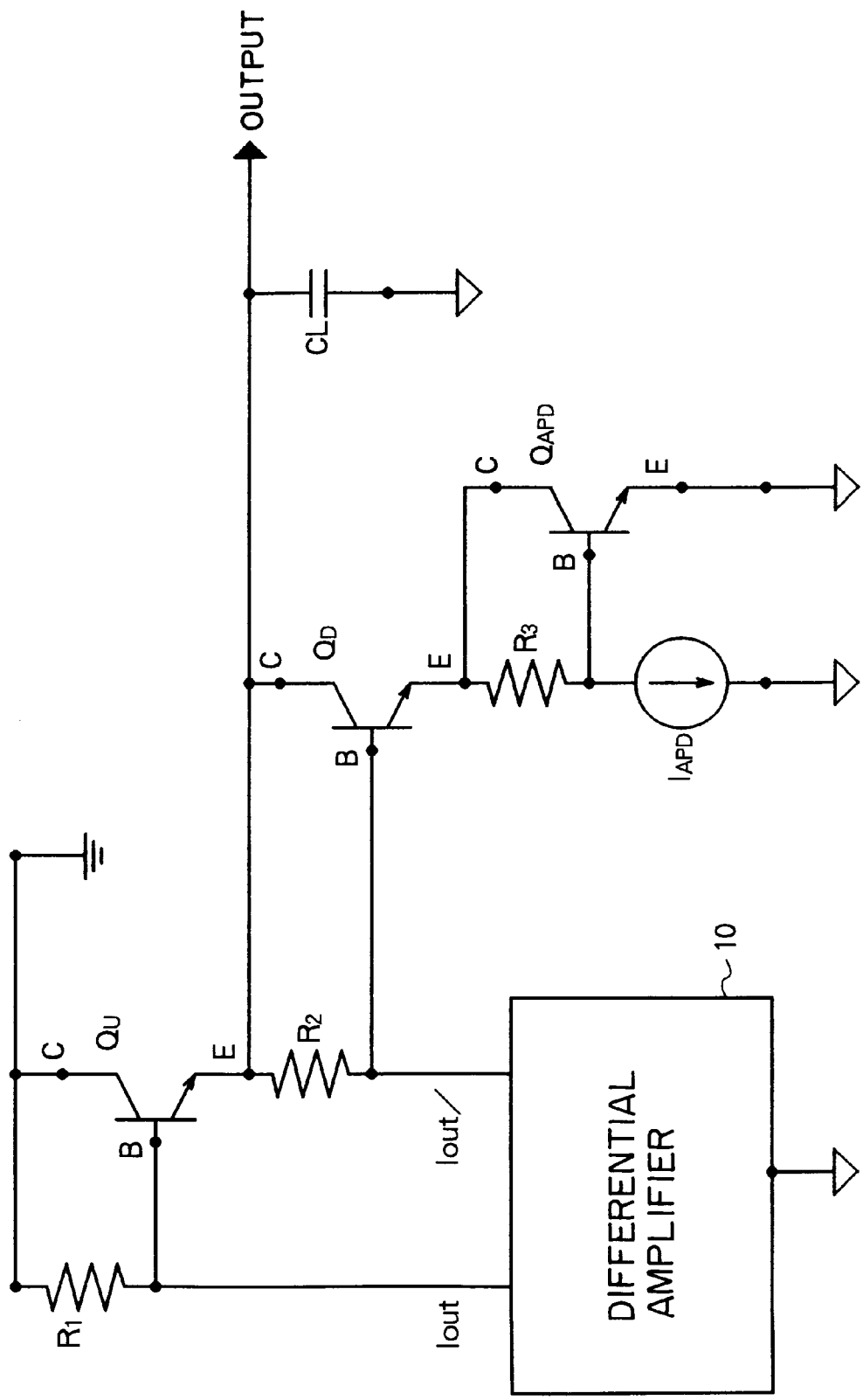
F I G. 2

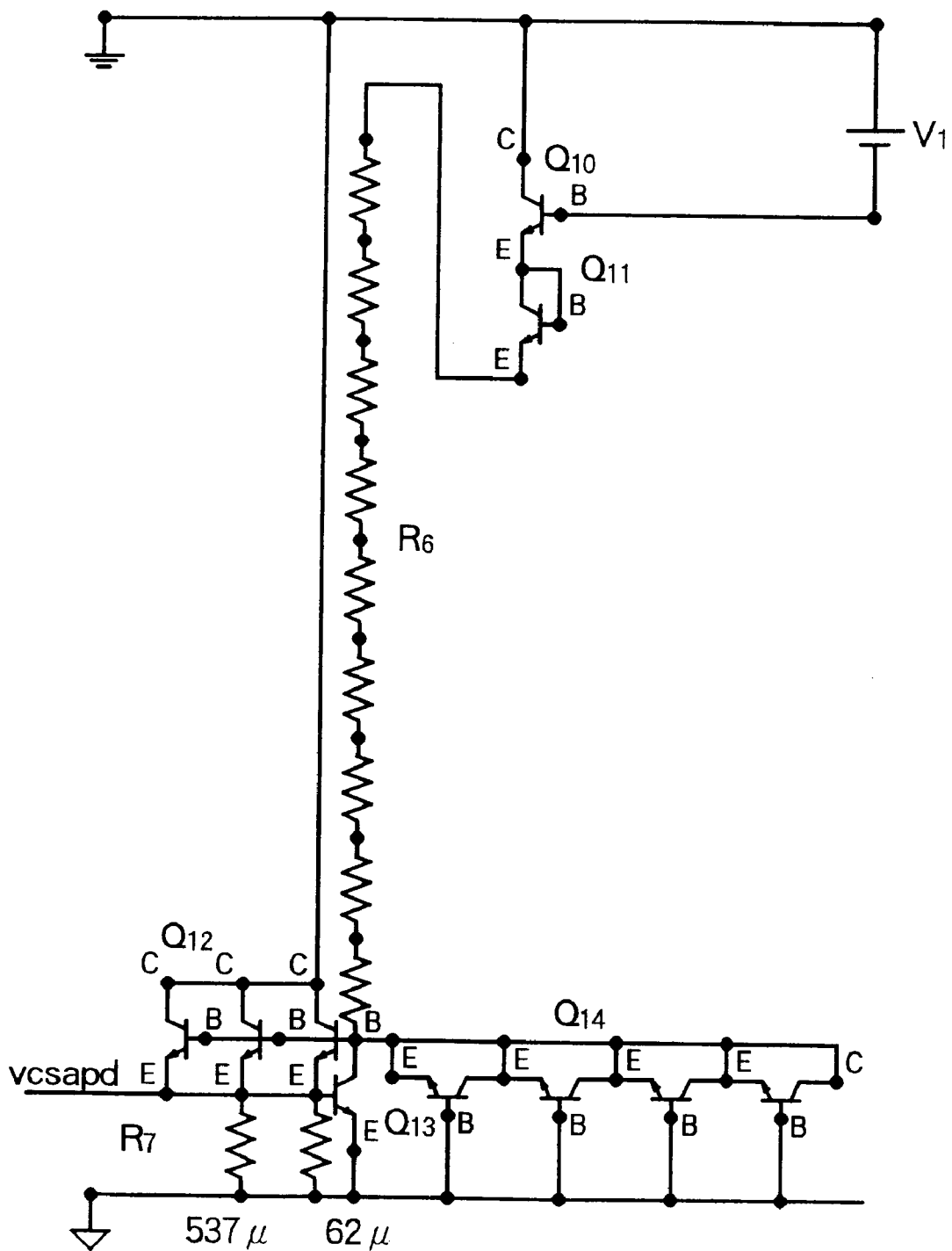
F I G. 4

LOGIC CIRCUIT

BACKGROUND OF THE INVENTION

1. Field of the Invention

The present invention relates generally to a logic circuit and, more particularly, to an ECL (Emitter Coupled Logic) circuit suitable for a high-speed large scale ECL circuit and Bi-CMOS LSI.

2. Description of the Background Art

An ECL circuit normally belongs to a bipolar integrated circuit and has a characteristic of operating at a frequency as high as 300 MHz or above.

FIG. 13 is a circuit diagram illustrating a construction of a first conventional ECL circuit shown in FIG. 1 of Japanese Patent Laid-Open Publication No.7-142991.

This circuit is a 3-input OR/NOR gate ECL circuit based on a 2-stage construction consisting of a differential logic stage including a current switch and an output emitter follower stage serving as a buffer output.

Three NPN transistors Q101-1, Q101-2, Q101-3 connected in parallel form an arm on one side of the differential logic stage, and, besides, with bases thereof serving as input terminals of the circuit of the differential logic stage, input signals INA, INB, INC are respectively supplied thereto. A reference potential defined an earth potential is supplied to a collector common connecting point via a load resistor R101, and a constant current source ICS is connected to an emitter common connecting point. Further, an arm on the other side of the differential logic stage is constructed of an NPN transistor Q102 a base of which is supplied with a reference potential VBB1. Then, a collector thereof is supplied with the reference potential as the earth potential through a load resistor R102, and an emitter thereof is connected to the constant current source ICS.

In this circuit, if one or more signals among the three input signals INA, INB, INC supplied to the bases of the three NPN transistors Q101-1, Q101-2, Q101-3 is higher than the reference potential VBB1, the relevant NPN transistor is turned ON, whereby the current starts flowing across the load resistor R101. With this inflow of the current, the potential at the emitter common connecting point rises till the NPN transistor Q102 is turned OFF. In this state, no current flows across the load resistor R102. At lest one of the NPN transistors Q101-1, Q101-2, Q101-3 is turned ON, whereas the NPN transistor Q102 is turned OFF. Hence, a collector potential of the left-side arm assumes an "L" level, while a collector potential of the NPN transistor Q102 takes an "H" level. Normally, the emitter follower circuits are connected as output stages respectively to the two arms of the differential logic stage, and a base of an emitter follower NPN transistor is connected to a connecting point between the load resistor R101 or R102 and the collector of the transistor. Accordingly, when the current flows through the input-side arm of the differential logic stage, an output Z of the emitter follower stage of the other-side arm is set at the "H" level, and an output /Z of the emitter follower stage of the input-side arm of the differential logic stage is set at the "L" level.

On the other hand, when all the three input signals INA, INB, INC become lower than the reference potential VBB1, a current ICS of the constant current source ICS flows to the other-side arm of the differential logic stage. Then, the output Z assumes the "L" level, and the output /Z takes the "H" level.

As discussed above, with respect to the logic output Z, OR outputs of the three input signals INA, INB, INC are obtained.

FIG. 14 is a circuit diagram showing a construction of a second conventional ECL circuit shown in Japanese Patent Laid-Open Publication No.7-142991.

This circuit is referred to as an active pull-down ECL circuit or an APD (Active Pull-Down) circuit that can be constructed to permit a flow of large transient current when switching but to consume a small steady-state current when remaining static.

The differential logic stage is constructed of two pieces of NPN transistors Q101, Q102, and an input signal IN is supplied to a base of the NPN transistor Q101 Then, the reference potential defined as the ground potential is supplied to a collector of the NPN transistor Q101 via the resistor R101. The constant current source ICS is connected to an emitter common connecting point of the NPN transistors Q101, Q102, and a power supply VEE is connected to the other side of the constant current source ICS. A connecting node A between the resistor R101 and the collector of the NPN transistor Q101, is connected to a base of a charge bipolar transistor QU. The reference potential as the ground potential is supplied to the collector of the charge bipolar transistor QU, and an emitter thereof is connected to a collector of the NPN transistor Q102 via the resistor R102. A base of the NPN transistor Q102 is supplied with the reference potential VBB1. A connecting node between the emitter of the transistor QU and the resistor R102 is connected to a collector of a discharge NPN bipolar transistor QD, and serves as an output terminal OUT. The base of the discharge NPN bipolar transistor QD is connected to a connecting node B between the resistor R102 and the collector of the NPN transistor Q102, and the emitter of the discharge NPN bipolar transistor QD is supplied with a reference potential VREG.

In this circuit, when the potential at the connecting node point A falls in a state where a large capacitance is connected to the output terminal OUT, the charge bipolar transistor QU momentarily cuts off. At this time, the potential at the base point B of the transistor QD rises, and the emitted of the transistor QD is supplied with the reference potential VREG. Therefore, the transistor QD is strongly switched ON. That is, an inter base-emitter voltage increases, and a large collector current flows. Accordingly, electric charges accumulated in the load capacitance are abruptly discharged via the transistor QD. The circuit is constructed so that a fall propagation delay time is thereby reduced.

Further, Japanese Patent Laid-Open Publication No.7-58617 discloses an ECL circuit constructed such that the reference potential VREG in the ECL circuit in FIG. 14 serves as a supply reference potential VEE, wherein an operating principle thereof is the same as that of the ECL circuit in FIG. 14.

The problems existing in the ECL circuits shown in FIGS. 13 and 14 are as follows.

In the first ECL circuit in FIG. 13, when the potential of the other-side arm rises to the "H" level from the "L" level upon a turn-OFF of the NPN transistor Q101, the output Z is driven by an emitter follower transistor Q104, and hence a switch-over is carried out at a high speed. When the potential of the other-side arm falls down to the "L" level from the "H" level upon a turn-ON of the NPN transistor Q102, however, the fall propagation delay time thereof largely depends on a static current flowing across the emitter follower output stage, and a switching operation is slow in the ECL circuit on a long-wired chip. Then, the problem is that the electric power is more consumed as the operation is more speeded up.

On the other hand, in the second ECL circuit in FIG. 14, there exists the following problem.

FIG. 15 is a circuit diagram showing a construction of the second ECL circuit (APD circuit) in FIG. 14 when actually used. As illustrated in FIG. 15, when actually requiring the second ECL circuit (APD circuit) in FIG. 14, a constant potential generating circuit for generating a proper constant potential VREG is needed. Besides, another APD circuit is also normally connected to a VREG line supplied with the constant potential VREG. It is assumed that a plurality of APD circuits in FIG. 15 include the APD circuit defined as the second ECL circuit in FIG. 14, and it is also considered that outputs of all the APD circuits simultaneously fall in a state where the plurality of APD circuits are connected to the constant potential generating circuit for generating the constant potential VREG.

When the output of all the APD circuits simultaneously fall, the discharge NPN bipolar transistor QD is strongly switched ON, and the electric charges accumulated in the load capacitance flow into the VREG line via the transistor QD. Besides, the electric charges get confluent into the VREG line from all the APD circuits. Normally, an output impedance of a constant potential generating circuit is not 0, and hence, when a large current flows into the output thereof, the constant potential VREG is to rise. As a result, a discharge capability of the discharge NPN bipolar transistor QD declines, and it follows that the fall propagation delay time increases. A degree of increase in this fall propagation delay time depends on the number of APD circuits which are simultaneously switched. Consequently, there is caused a defect of being inconvenient in actual use.

To obviate this defect, an ECL circuit which follows is constructed.

FIG. 16 is a circuit diagram showing a construction of a third prior art ECL circuit as disclosed in FIG. 5 in Japanese Patent Laid-Open Publication No.7-142991.

FIG. 16 shows the third ECL circuit that is substantially the same construction as the second ECL circuit in FIG. 14. The third ECL circuit is, however, constructed not by connecting the constant potential generating circuit directly to the emitter of the discharge NPN bipolar transistor QD but by connecting the emitter of the transistor QD to the supply reference potential VEE trough a capacitor CD and a constant current source ICO, which are connected in parallel.

According to this construction, the constant potential VREG is automatically set to such a potential that the current flowing through a route of GND–QU–QD–VREG, becomes the constant current ICO. A large load discharge current needed for transient switching is supplied through the capacitor CD.

In this circuit construction, however, the electric charges accumulated in the load capacitance must be temporarily stored in the capacitor CD, and it is therefore required that at least a capacitance over the load capacitance be secured for the capacitor CD. It may happen that this load capacitance ranges to several pF, and consequently there must be a defect of requiring a a comparatively large area for disposing the capacitor CD.

Further, the following defect arises. In the ECL circuit (Japanese Patent Laid-Open Publication No.7-58617) in which the reference potential VREG in the second ECL circuit shown in FIG. 14 serves as the supply reference potential VEE, since a VREG terminal in FIG. 14 is connected to a power supply for supplying the supply reference potential VEE, the supply reference potential VEE can be set to merely a value as small as −2 V, nevertheless, the supply reference potential VEE normally used is on the order of −4.5 V or −5.2 V.

SUMMARY OF THE INVENTION

It is a first object of the present invention to provide a logic circuit operable at a standard power supply potential at a high speed and requiring a low amount of electric power to be consumed.

It is a second object of the present invention to provide a logic circuit with no deterioration in characteristic due to simultaneous switching of a plurality of circuits.

It is a third object of the present invention to provide a logic circuit capable of enhancing a degree of integration without requiring a large-capacity capacitor.

According to the present invention, there is provided a logic circuit comprising:

a differential logic circuit including first and second differential current output nodes for outputting first and second differential current outputs complementary to each other in accordance with one or more input signals;

a first load resistor having one terminal connected to said first differential current output node, and the other terminal connected to a first power supply for supplying a first reference potential;

a second load resistor, one terminal of which being connected to said second differential current output node;

a first NPN transistor having a base connected to one terminal of said first load resistor, a collector connected to said first power supply, and an emitter connected to the other terminal of said second load resistor;

a second NPN transistor having a base connected to one terminal of said second load resistor, and a collector connected to a connecting node between the other terminal of said second load resistor and the emitter of said first NPN transistor;

a third load resistor, one terminal of which being connected to the emitter of said second NPN transistor;

a constant current source having its positive pole side connected to the other terminal of said third load resistor, and its negative pole side connected to a second power supply for supplying a second reference potential;

a third NPN transistor having a base connected to a connecting node between the other terminal of said third load resistor and said constant current source, a collector connected to a connecting node between the emitter of said second NPN transistor and one terminal of said third load resistor, and an emitter connected to said second power supply; and an output node for outputting an output signal from a common connecting node of the emitter of said first NPN transistor, the other terminal of said second load resistor and the collector of said second NPN transistor.

In this circuit, the same construction as a constant potential generating circuit hitherto provided independently of the ECL circuit, is provided inwardly of the ECL circuit. Therefore, it is feasible to provide the ECL logic circuit operable at the power supply potential of −4.5 V or −5.2 V at the high speed and requiring the small quantity of electric power to be consumed without characteristic deterioration due to simultaneous switching while restraining an areal increase. The constant current source is an NPN transistor whose base is connected to an output node of a bias circuit, and the output of the bias circuit is an output having a value set so that a collector current of the active pull-down transistor is kept constant at all times. Hence, the electric power consumption can be further reduced.

BRIEF DESCRIPTION OF THE DRAWINGS

FIG. 2 is a circuit diagram sowing a construction of the logic circuit in a second embodiment of the present invention;

FIG. 4 is a circuit diagram illustrating a construction of a bias circuit;

DESCRIPTION OF THE PREFERRED EMBODIMENTS

Embodiments of a logic circuit according the present invention will be discussed with reference to the drawings.

Figure 1A:
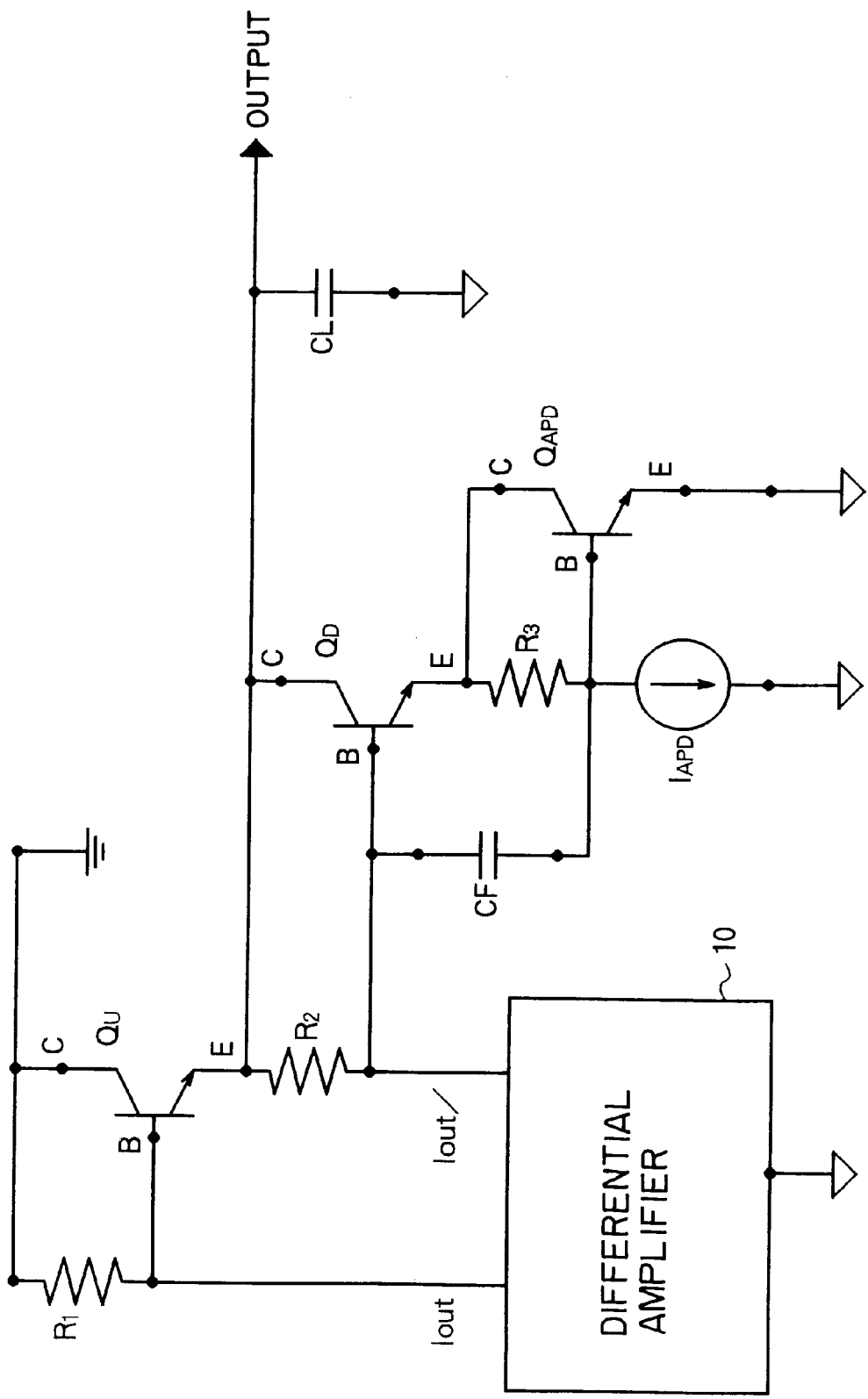
FIG. 1A is a circuit diagram showing a construction of a logic circuit in a first embodiment of the present invention.

FIG. 1A is a circuit diagram of a logic circuit in accordance with a first embodiment of the present invention, illustrating a most basic construction showing the principle of the logic circuit according to the present invention.

One terminal of a load resistor R1 is connected to a collector, and the other terminal of the load resistor R1 is connected to a base of a charging bipolar transistor QU to whose collector a reference potential normally serving as an ground potential is supplied. One terminal of a load resistor R2 is connected to an emitter thereof. Connected to the other terminal of the load resistor R1 is one differential current output IOUT of a differential amplifier 10, and the other terminal of the load resistor R2 is connected to an another differential current output /IOUT. The differential current outputs IOUT and /IOUT of the differential amplifier are in a complementary relationship. A predetermined reference potential is supplied to the differential amplifier 10. The other terminal of the load resistor R2 is connected to a base of a discharge NPN bipolar transistor QD a collector of which is connected to one terminal of the load resistor R2, and one terminal of a load resistor R3 is connected to an emitter thereof. One terminal of a constant current source IAPD is connected to the other terminal of the load resistor R3. Further, one terminals of the load resistor R3 is connected to a collector of a transistor QAPD, and the other terminal of the load resistor R3 is connected to a base thereof. The predetermined reference potential is supplied to the other terminal of the constant current source IAPD and to the emitter of the transistor QAPD. Also, one terminal of an output load capacitance CL is connected to one terminals of the load resistor R2 and to the collector of the discharge NPN bipolar transistor QD, and the predetermined reference potential is supplied to the other terminal of the output load capacitance CL. Further, a capacitor CF for giving a much higher speed to a switching operation, is connected between the base of the discharge NPN bipolar transistor QD and the other terminal of the load resistor R3. As will be mentioned later on, however, this capacitor CF may not be provided depending upon the operating speed required.

A characteristic in terms of the construction of the logic circuit according to the present invention is that the ECL circuit incorporates the same construction as that of the constant potential generating circuit hitherto provided independently of the ECL circuit, and the portion corresponding to the constant potential generating circuit is constructed of the load resistor R3, the transistor QAPD and the constant current source IAPD.

Next, an operating principle of the logic circuit in the first embodiment will be explained.

To start with, it is assumed that the output falls under such a condition that a capacity of the output load capacitance CL is large, i.e., that the charge bipolar transistor QU cuts off with a later operation, viz., it is assumed that one differential current output IOUT changes from O to I, while the other differential current output /IOUT changes from I to O, where I is the electric current from the differential amplifier. At this time, the potential of the base of the transistor QU quickly transits from an "H" level down to a "L" level. The transition of the potential of the emitter is, however, delayed due to the large capacity of the output load capacitance CL. Accordingly, the transistor QU temporarily cuts off, and, because of the differential current output /IOUT being "O", the base of the discharge NPN bipolar transistor QD momentarily rises toward the output potential assuming the "H" level. With this ascent, the potential of the base of the transistor QAPD also increases, and, in addition, the base of the transistor QAPD is supplied with a base current via the capacitor CF. Hence, the transistor QAPD is switched ON strongly, i.e., an inter base-emitter voltage of the transistor QAPD increases enough to generate a large collector current, with the result that electric charges accumulated in the output load capacitance CL are quickly discharged through the transistor QD. Accordingly, a fall propagation delay time is remarkably reduced.

On the other hand, when the output falls under such a condition that the capacity of the output load capacitance CL is small, i.e., that the charge bipolar transistor QU does not cut off with a later operation, viz., when one differential current output IOUT changes from O to I, while the other differential current output /IOUT changes from I to O, the transistor QU does not cut off, and hence the base potential of the transistor QD does not rise either. Then, the electric charges accumulated in the output load capacitance CL are discharged via the transistor QD in a state where the transistor QAPD is not switched ON strongly.

Next, it is assumed that the output rises, i.e., that one differential current output IOUT changes from I to O, while the other differential current output /IOUT changes from O to I. In this case, the output load capacitance CL is charged with the electricity via an emitter follower circuit consisting of the charge bipolar transistor QU irrespective of a magnitude of the capacity of the output load capacitance CL, and therefore high-speed switching is attained as in the case of the conventional type ECL circuit.

Note that the currents flowing across the transistor QAPD and the constant current source IAPD are minutely restricted, and consequently the electric power consumed is small in a static state exclusive of the transient state on the occasion of the switching operation.

Accordingly, it is possible to provide the ECL circuit operable under a power supply electric potential on the order of −4.5 V or −5.2 V without causing any characteristic deterioration due to the simultaneous switching while restraining an increase in the area, which ECL circuit operates at the high speed and requires a less amount of electric power consumption.

Figure 1B:
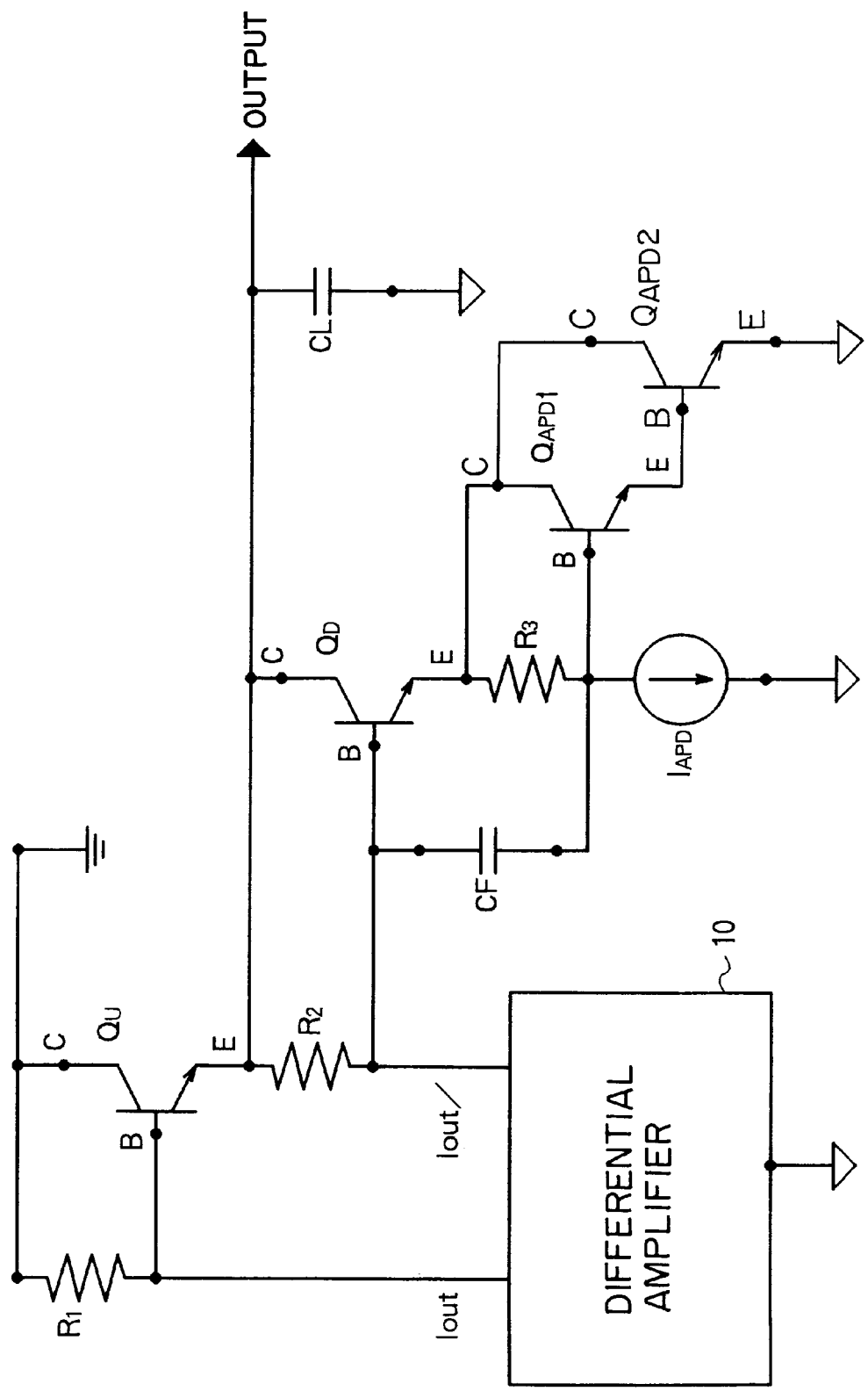
FIG. 1B is a circuit diagram showing a variation of the circuit shown in FIG. 1A.

FIG. 1B is a circuit diagram showing a circuit which is a variation of the circuit shown in FIG. 1A. In FIG. 1B, the transistor QAPD in FIG. 1A is replaced with a Darlington connection amplifier QAPD1 and QAPD2.

FIG. 2 is a circuit diagram showing a construction of the logic circuit in a second embodiment of the present invention.

The logic circuit in the second embodiment in FIG. 2 is constructed such that the capacitor CF provided between the base of the discharge NPN bipolar transistor QD and the other terminal of the load resistor R3 is eliminated in the construction of the logic circuit in the first embodiment in FIG. 1.

According to the construction of the logic circuit in the second embodiment, when the output falls under such a condition that the capacity of the output load capacitance CL is large, i.e., that the charge bipolar transistor QU cuts off with a later operation, viz., when one differential current output IOUT changes from O to I, while the other differential current output /IOUT changes from I to O, the speed of the switching operation is approximately twice under such a condition that the output load capacitance CL=2 pF, which is slightly delayed as compared with the case where the capacitor CF is connected between the base of the discharge NPN bipolar transistor QD and the other terminal of the load resistor R3. This switching speed is, however, well faster than in the conventional ECL circuits. Other operations are the same as those in the construction in the first embodiment.

Hence, when compared with the construction of the logic circuit in the first embodiment, the increase in the area can be further restrained, and the construction given above is effective depending upon a relationship between the operating speed required and the usable circuit area.

Figure 3:
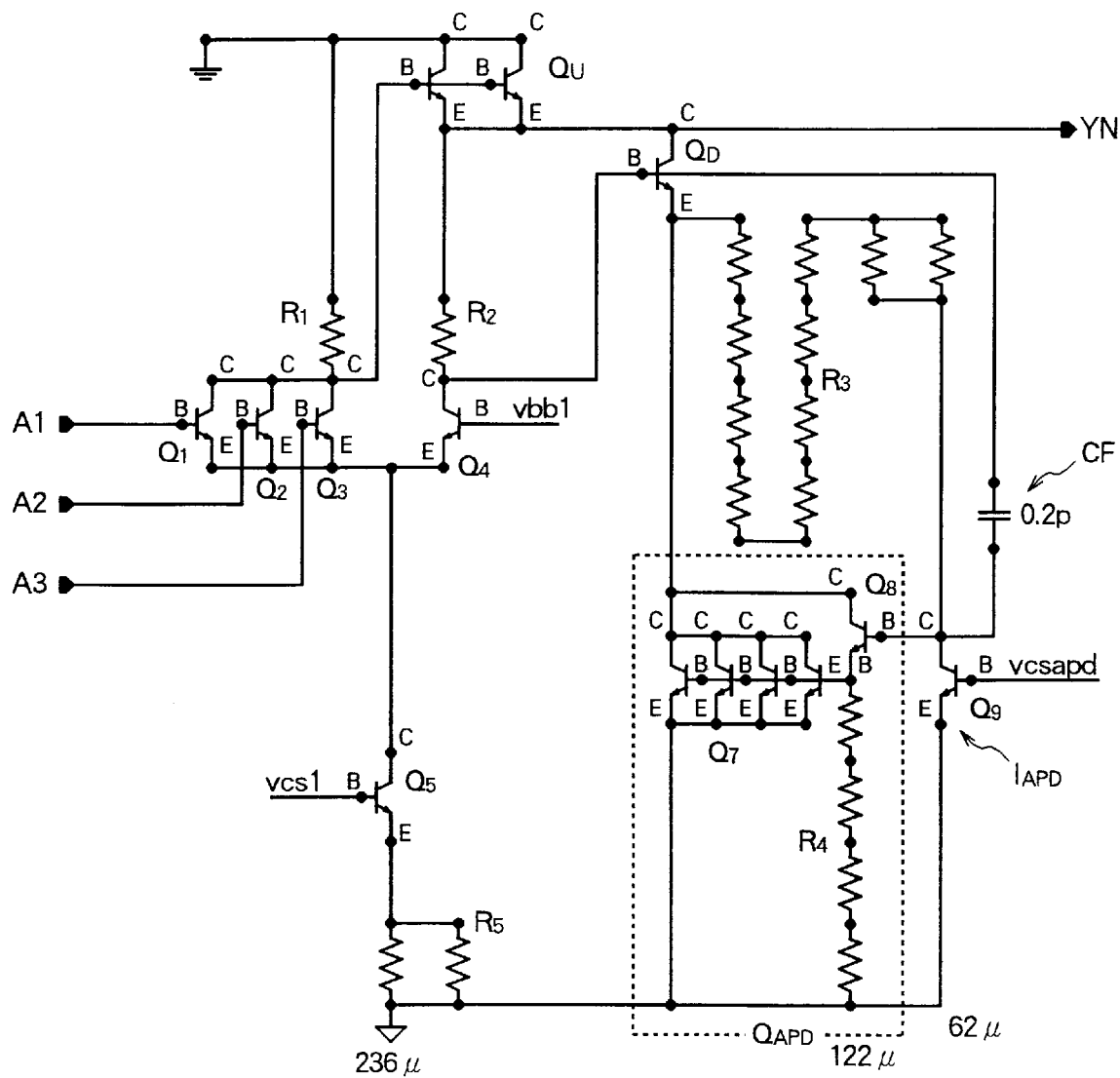
FIG. 3 is a circuit diagram showing a construction of the logic circuit in a third embodiment of the present invention.

FIG. 3 is a circuit diagram showing a construction of the logic circuit in accordance with a third embodiment of the present invention, wherein the logic circuit of the present invention is applied to a 3-input NOR logic circuit.

Three NPN transistors Q1, Q2, Q3 connected in parallel form an arm on one side of a differential logic stage, and, besides, bases thereof serve as circuit input terminals of the differential logic stage. Inputs A1, A2, A3 are given respectively to these input terminals The reference potential as the ground potential is supplied to a collector common connecting point via the load resistor R1. Connected to an emitter common connecting point are a load resistor R5 and a transistor Q5 serving as a constant current source, and the predetermined reference potential is supplied to one terminal of the load resistor R5 Further, the other arm of the differential logic stage is constructed of an NPN transistor Q4 a base of which is supplied with a reference potential Vbb1. A collector of the transistor Q4 is connected to one terminal of the load resistor R2, while an emitter is connected to a collector of the transistor Q5. The transistors Q1–Q4 constitute a differential amplifier of an input NOR logic circuit- The emitter of the charge bipolar transistor QU is connected to the other terminal of the load resistor R2, and the base of the transistor QU is connected to the collector common connecting point of the three NPN transistors Q1, Q2, Q3. Then, the reference potential as the ground potential is supplied to the collector of the transistor QU. The emitter of the transistor QU is connected to the collector of the discharge NPN bipolar transistor QD, and, on the other hand, an output YN is taken out. The base of the transistor QD is connected to a connection node between the collector of the transistor Q4 and one terminal of the load resistor R2, and the emitter of the transistor QD is connected to one terminal of the load resistor R3, a collector of a transistor Q7 and a collector of a transistor Q8. A base of the transistor Q7 is connected to an emitter of the transistor Q8 and one terminal of the load resistor R4. A base of the transistor Q8 is connected to a collector of a transistor Q9 constituting the constant current source IAPD as well as to the other terminal of the load resistor R3. The predetermined reference potential is supplied to the emitter of the transistor Q7, the other terminal of the load resistor R4, and the emitter of the transistor Q9. A circuit based on a Darlington construction, which is constructed of the transistors Q7, Q8 and the load resistor R4, constitutes the transistor QAPD in FIG. 1. Further, the capacitor CF for giving a much higher speed to the switching operation, is connected between the base of the discharge NPN bipolar transistor QD and the other terminal of the load resistor R3. Connected also to a base of a transistor Q9 is a bias circuit for generating such a voltage as to always make constant the currents flowing across the transistors Q7, Q8 in the static state exclusive of the transient state on the occasion of the switching operation.

An operation of the 3-input NOR logic circuit in the third embodiment of the present, invention will be hereinafter discussed.

To begin with, it is assumed that an output YN falls, i.e., one of the inputs A1, A2, A3 rises under such a condition that the large load capacitance CL is connected to the output YN, viz., that the charge bipolar transistor QU cuts off with a later operation. At this time, it follows that the current from the constant current source consisting of the transistor Q5 and the load resistor R5 flows via the resistor R1 and any of the transistors Q1–Q3, in which the inputs A1, A2, A3 have risen, and the potential of the base of the charge bipolar transistor QU quickly decreases from 0 V down to −I×R1 (I is the current from the constant current source). The transistor Q4 changes from an ON-state to an OFF-state, and, because of the output YN having been an output −VBEQU assuming the "H" level due to an existence of the load capacitance CL, the transistor QU momentarily cuts off.

Then, the base potential of the transistor QD starts rising from −VBEQU−I×R2 toward −VBEQU. Corresponding to this rise, the base potential of the transistor Q8 rises due to the existences of the load resistor R3 and of the capacitor CF, whereby the transistors Q8 and Q7 are strongly switched ON. Then, the electric charges accumulated in the load capacitance CL are quickly discharged via the discharge NPN bipolar transistor QD. After being discharged, the output YN falls, and the base potential of the transistor QD decreases down to −VBEQU−I×R1, and the base potential of the transistor Q8 also decreases. Hence, the currents running across the transistors Q7, Q8 become minute, with the result that the consumption electric power is reduced.

On the other hand, under the condition that the capacity of the load capacitance CL is small, i.e., that the charge bipolar transistor QU does not cut off with a later operation, the transistor QU does not cut off, and the potential of the output YN follows after the base potential of the transistor QU. The base potential of the discharge NPN bipolar transistor QD does not rise, and the electric charges accumulated in the load capacitance CL are discharged by the static currents flowing across the transistors Q7–Q9.

Next, it is considered that the output YN rises, viz., that all the inputs A1–A3 takes the "L" level. At this time, it follows that the current from the constant current source consisting of the transistor Q5 and the load resistor R5 flows through the resistor R2 and the transistor Q4, and the base potential of the transistor QU rises from −I×R1 up to 0 V. Then, the load capacitance CL is, irrespective of a magnitude of the capacity thereof, quickly charged with the emitter current of the transistor QU. The base potential of the discharge NPN bipolar transistor QD transits to −VBEQU−I×R2. Supposing that a magnitude of the load resistor R1 is equal to a magnitude of the load resistor R2, the base potential of the transistor QD is equalized to the one when the output YN assumes the "L" level. In this case also, the consumption electric power is small.

FIG. 4 is a circuit diagram showing a construction of the bias circuit. Connected, as described above, to the base of the transistor Q9 in FIG. 3 is the bias circuit for generating such a voltage as to always make constant the currents flowing across the transistors Q7, Q8 in the static state exclusive of the transient state on the occasion of the switching operation. FIG. 4 illustrates one example of such a bias circuit.

A DC power supply V1 is connected between the collector and the base of a transistor Q10 having its collector supplied with the reference potential serving as the ground potential, and a base and a collector of a transistor Q11 are connected to an emitter of the transistor Q10. The other terminal of a load terminal R6 is connected to a base of a transistor Q12, a collector of a transistor Q13 and a collector and an emitter of a transistor Q14. The reference potential defined as the ground potential is supplied to a collector of the transistor Q12. One terminal of the load resistor R7 is connected to an emitter of the transistor Q12, and a bias voltage is generated therefrom. The predetermined reference potential is supplied to the other terminal of the load resistor R7, an emitter of a transistor Q13 and a base of a transistor Q14. The DC power supply V1 is set as a voltage source with no fluctuations both in voltage and in temperature.

This bias circuit is connected to the base of the transistor Q9 in FIG. 3, whereby the currents flowing across the transistors Q7, Q8 are kept constant at all times in the static state other than the transient state on the occasion of the switching operation, and the consumption electric power is reduced.

Figure 5:
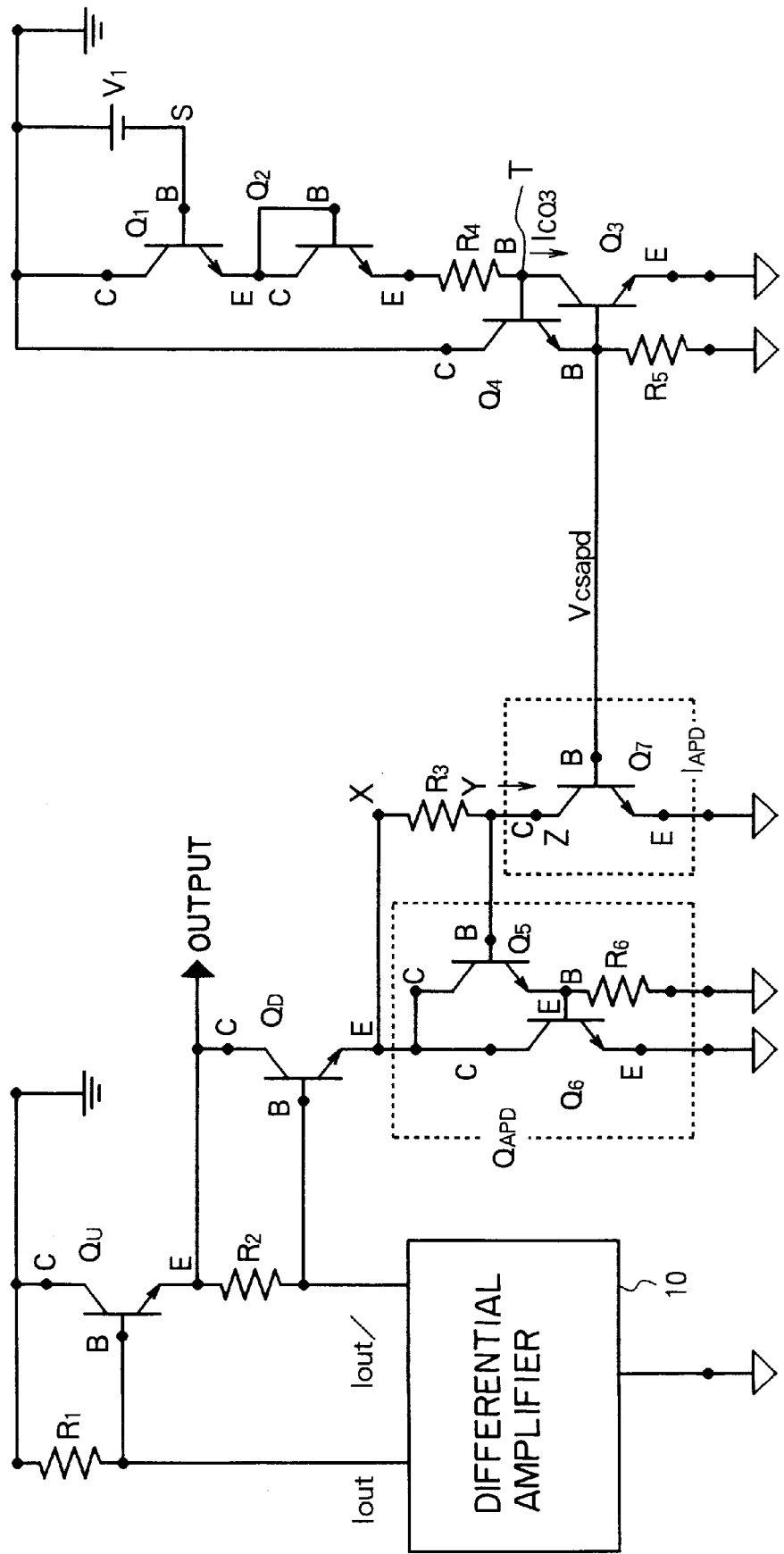
FIG. 5 is a circuit diagram of the logic circuit according to the present invention, to which the bias circuit is connected.

FIG. 5 is a circuit diagram illustrating a construction of the logic circuit according to the present invention, to which the bias circuit is connected.

Constructive elements of the logic circuit of the present invention are constructed as follows. The other terminal of the load resistor R1 is connected to the base of the charge bipolar transistor QU having its collector connected to one terminal of the load resistor Ri and normally supplied with the reference potential as the ground potential, and one terminal of the load resistor R2 is connected to an emitter thereof. One differential current output IOUT of the differential amplifier 10 is connected to the other terminal of the load resistor R1, and the other differential current output /OUT of the differential amplifier 10 is connected to the other terminal of the load resistor R2. The differential current outputs IOUT and IOUT of the differential amplifier are in a complementary relationship. A predetermined reference potential is supplied to the differential amplifier 10. The other terminal of the load resistor R2 is connected to the base of the discharge NPN bipolar transistor QD a collector of which is connected to one terminal of the load resistor R2. Connected to an emitter thereof are a node X defined as one terminal of the load resistor R3, and collectors of the transistors Q5, Q6. The emitter of the transistor Q5, the base of the transistor Q6 and one terminal of the load resistor R6 are connected to each other, and the predetermined reference potential is supplied to the emitter of the transistor Q6 and to the other terminal of the load resistor R6. A Darlington amplifier QAPD is constructed of the transistors Q5, Q6 and the load resistor R6. The base of the transistor Q5 is connected to a node Y defined as the other terminal of the load resistor R3. Further, a node Z defined as the collector of the transistor Q7 is connected to the node Y, and the emitter of the transistor Q7 is supplied with the predetermined reference potential. The transistor Q7 constitutes the constant current source IAPD.

On the other hand, constructive elements of the bias circuit are constructed as follows. The DC power supply V1 is connected between the collector and the base of the transistor Q1 having its collector supplied with the reference potential serving as the ground potential, and the base and the collector of the transistor Q2 are connected to the emitter of the transistor Q1. One terminal of the load terminal R4 is connected to the emitter of the transistor Q2. A node S is set between the base of the transistor Q1 and a negative pole side of the DC power supply V1. The other terminal of the load resistor R4 defined as a node T is connected to the base of the transistor Q4 and to the collector of the transistor Q3. The emitter of the transistor Q4, the base of the transistor Q3 and one terminal of the load resistor R5 are connected to each other, and the predetermined potential is supplied to the emitter of the transistor Q3 and to the other terminal of the load resistor R5. The DC power supply V1 is set as a voltage source with no fluctuations both in voltage and in temperature.

The base of the transistor Q7 of the logic circuit, the one terminal of the load resistor R5, the base of the transistor Q3 and the emitter of the transistor Q4 of the bias circuit according to the present invention described above, are connected to each other, and a bias potential is supplied to the base of the transistor Q7. Further, it is herein assumed that the each of the predetermined reference potentials given above is supplied by a power supply voltage VEE.

Figure 6A:
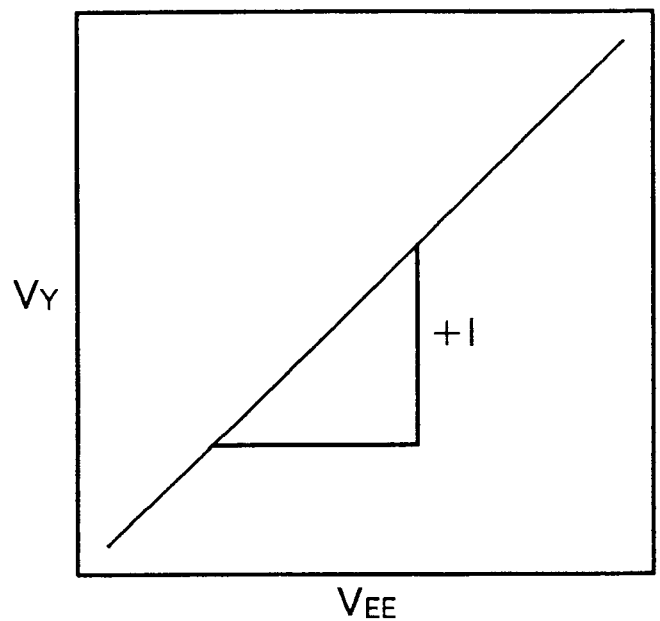
FIGS. 6A and 6B are graphs showing variations in potential and in current when a power supply voltage VEE fluctuates.
Figure 6B:
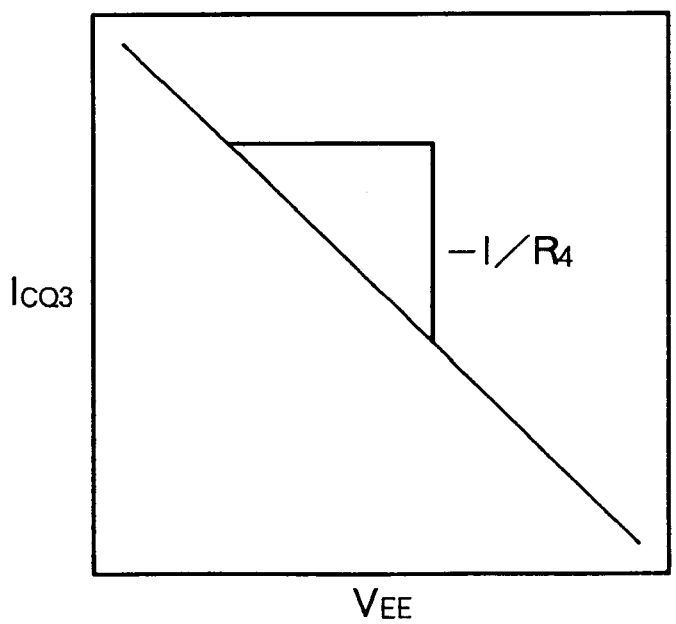

FIGS. 6A and 6B are graphs showing variations in the potential and the current when the power supply voltage VEE fluctuates. FIG. 6A is the graph showing variations in a potential VY of the node Y. FIG. 6B is the graph showing variations in a current ICQ3 (a collector current of the transistor Q3) flowing across the node T or Y (the load resistor R4 or R3).

The potential of the node S in the bias circuit is held constant by the power supply V1 even when the power supply voltage VEE fluctuates. Accordingly, the collector current ICQ3 of the transistor Q3 is given by:

$$ICQ3 = IR4 = VR4/R4$$

and $$dVR4/dVEE = -1$$

hence, $$dIR4/dVEE = -1/R4$$

where VR4 is the voltage applied to the load resistor R4, and IR4 is the current flowing across the load resistor R4. A current mirror circuit is established by a portion including the load resistors R3, R4, and, since a current equal to a current IR4 flows also to the load resistor R3, the potential of the node Y is given by:

$$VY = VX - IR4 \times R3$$

where VX is the potential of the node X. Supposing that is so designed as to be held constant even when the power supply voltage VEE fluctuates;

$$dVY/dVEE = -dIR4/dVEE \times R3 \times IR4 \times dR3/dVEEA = R3/R4$$

and, when R3=R4, the result is:

$$dVY/dVEE = +1$$

Hence, the potential VY fluctuates the same as the power supply voltage VEE, and the collector currents of the transistors Q5, Q6 get fixed. Then, an APD capability is, even when the power supply voltage VEE fluctuates, held constant. FIGS. 6A and 6B are graphs showing results of the above-mentioned.

Figure 7A:
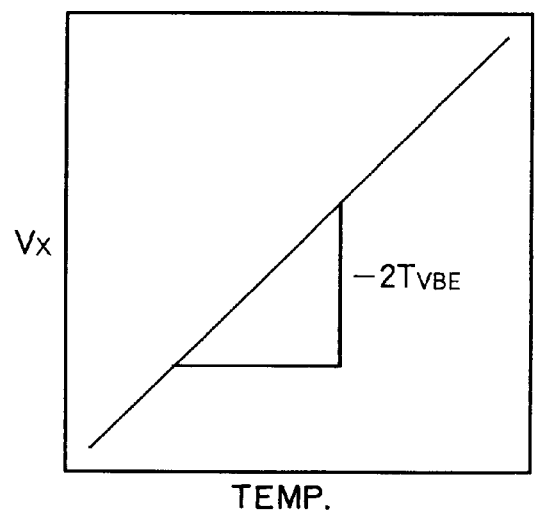
FIGS. 7A–7C are graphs showing variations in the potential and in the current when a temperature fluctuates.
Figure 7B:
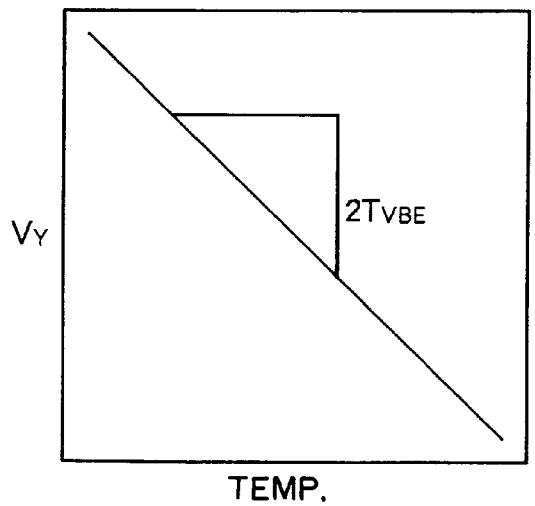
Figure 7C:
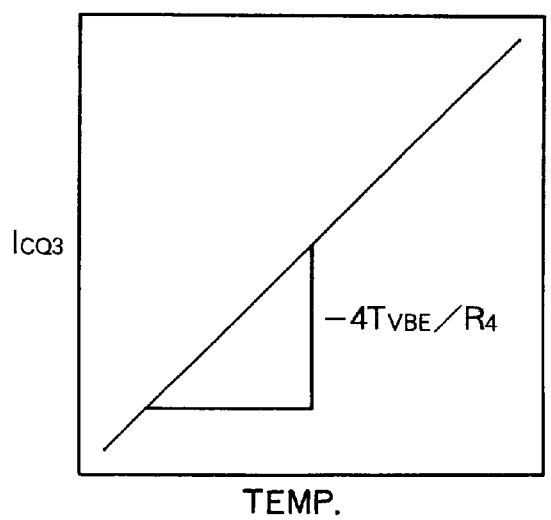

FIGS. 7A–7C are graphs showing variations in the potential and the current when the temperature fluctuates. FIG. 7A is the graph showing the variations in the potential VX of the node X. FIG. 7B is the graph showing the variations in the potential VY of the node Y. FIG. 7C is the graph showing the variations in the current ICQ3 (the collector current of the transistor Q3) flowing across the node T or Y (the load resistor R4 or R3).

Herein also, the potential of the node S in the bias circuit is held constant by the power supply V1 even when the temperature fluctuates.

$$VR4 = IR4 \times R4$$

where T is the temperature.
Hence, $$dVR4/dT = dIR4/dT \times R4 + IR4 \times dR4/dT \quad (1)$$

while, $$VY = VX - IR4 \times R3$$

therefore, $$dVY/dT = dVX/dT - dIR4/dT \times R3 - IR4 \times dR3/dT$$

from the equation (1), $$dIR4/dT = (dVR4/dT - IR4 \times dR4/dT)/R4$$

accordingly, when this is substituted, $$dVY/dT = dVX/dT - (dVR4/dT - IR4 \times dR4/dT) \times R3/R4 - IR4 \times dR3/dT$$

and, when R3=R4, $$dVY/dT = dVX/dT - dVR4/dT$$

and further, $$dVX/dT = -2 \times TVBE$$

$$dVR4/dT = -4 \times TVBE$$

where TVBE (=−1.5 mV/° C.) is the temperature coefficient of the inter forward-directional base-emitter voltage of the transistor.
Hence, $$dVY/dT = 2 \times TVBE < 0$$

Accordingly, in the Darlington amplifier QAPD, the flowing current does not fluctuate even when the temperature fluctuates, and the APD capability is held constant. FIGS. 7A–7C are graphs showing results of the above mentioned.

Figure 8:
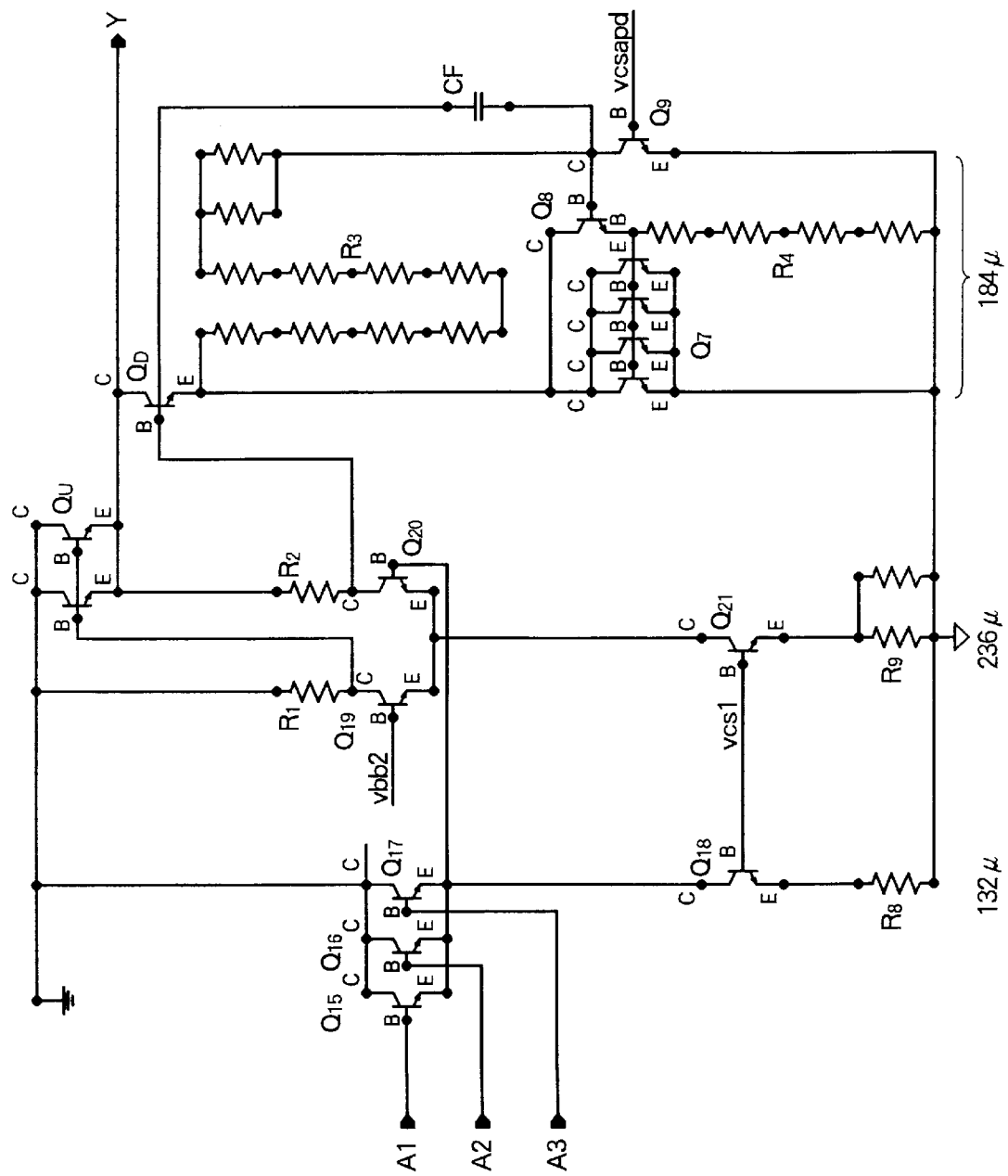
FIG. 8 is a circuit diagram showing a construction of the logic circuit in a fourth embodiment of the present invention.

FIG. 8 is a circuit diagram showing a construction of the logic circuit in a fourth embodiment of the present invention, wherein the logic circuit according to the present invention is applied to a 3-input OR logic circuit.

Three NPN transistors Q15, Q16, Q17 connected in parallel form an arm on one side of a differential logic stage, and, besides, bases of the transistors Q15–Q17 serve as circuit input terminals of the differential logic stage. Inputs A1, A2, A3 are given respectively to these input terminals. An emitter common connecting point of the transistors Q15–Q17 is connected to a base of a transistor Q20. The reference potential as the ground potential is supplied to a collector common connecting point of the transistors Q15–Q17. Connected to the emitter common connecting point are a load resistor R8 and a transistor Q18 serving as a constant current source, and the predetermined reference potential is supplied to one terminals of the load resistor R8. Further, an arm on the other side of the differential logic stage is constructed of an NPN transistor Q19 a base of which is supplied with a reference potential Vbb2. A collector of the transistor Q19 is connected to one terminal of the load resistor R1, and the other terminal of the load resistor R1 is supplied with the reference potential serving as the ground potential and is connected to the collector of the charge bipolar transistor QU. Further, the collector of the transistor Q20 is connected to one terminal of the load resistor R2, and the other terminal of the load resistor R2 is connected to the emitter of the transistor QU. The base of the transistor QU is connected to a connecting node between the transistor Q19 and the load resistor R1. Connected to an emitter common connecting point of the transistors Q19, Q20 are a load resistor R9 and a transistor Q21 serving as a constant current source, and the predetermined reference potential is supplied to one terminal of the load resistor R9. The bases of the transistors Q18, Q21 are connected to each other and are supplied with a reference potential Vcs1 to constitute a constant current source. The transistors Q15–Q17, Q19 and Q20 constitute a differential amplifier of the 3-input OR logic circuit.

The emitter of the transistor QU is connected to the collector of the discharge NPN bipolar transistor QD, and, on the other hand, an output Y is taken out. The base of the transistor QD is connected to a connecting node between the collector of the transistor Q20 and one terminal of the load resistor R2, and the emitter of the transistor QD is connected to one terminal of the load resistor R3 and to the collectors of the transistors Q7, Q8 The base of the transistor Q7 is connected to the emitter of the transistor Q8 and to one terminal of the load resistor R4, and the base of the transistor Q8 is connected to the other terminal of the load resistor R3 and to the collector of the transistor Q9 constituting the constant current source IAPD. The predetermined reference potential is supplied to the emitter of the transistor Q7, the other terminal of the load resistor R4 and the emitter of the transistor Q9. The transistorQAPD in FIG. 1 is constructed of a circuit based on the Darlington construction, which circuit consists of the transistors Q7, Q8 and the load resistor R4. Further, the capacitor CF for giving a much higher speed to the switching operation, is connected between the base of the discharge NPN bipolar transistor QD and the other terminal of the load resistor R3. Connected also to the base of the transistor Q9 is the bias circuit for generating such a voltage as to always make constant the currents flowing across the transistors Q7, Q8.

In the 3-input OR logic circuit in the fourth embodiment of the present invention, the 3-input OR logic circuit is constructed of the three transistors Q15, 16, 17 by the wired method. Other configurations are the same as those in the 3-input NOR logic circuit in the third embodiment in FIG. 3, and the basic operating principle is the same as the operating principle explained in the first through third embodiments in FIGS. 1 to 3.

Figure 9:
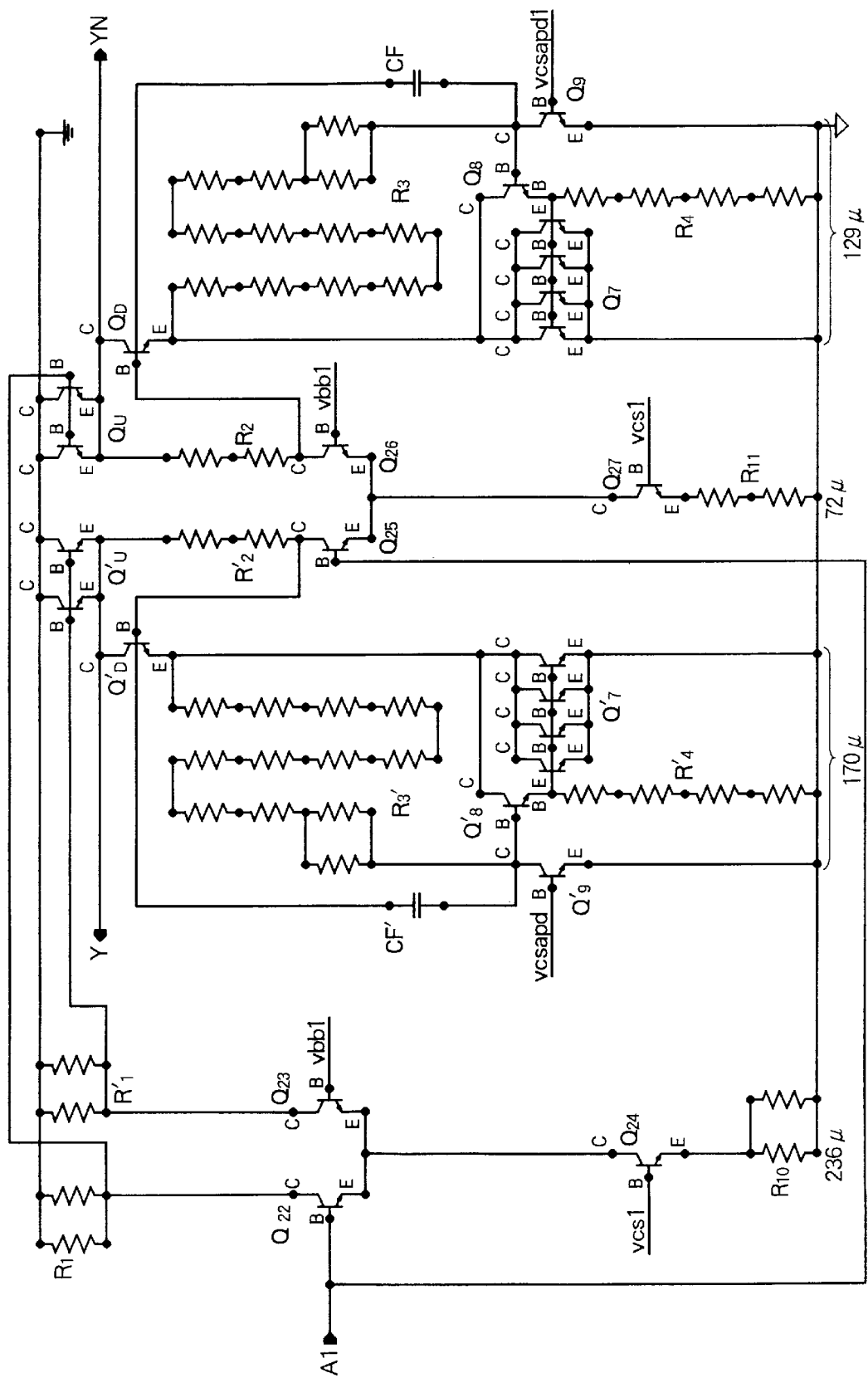
FIG. 9 is a circuit diagram showing a construction of the logic circuit in a fifth embodiment of the present invention.

FIG. 9 is a circuit diagram of a construction of the logic circuit in accordance with a fifth embodiment of the present invention, illustrating a first case where the logic circuit of the present invention is applied to a differential output circuit.

One terminals of the load resistor R1 and a load resistor R1' are connected to collectors of a transistor Q22 a base of which is supplied with the input A1, and of a transistor Q23 a base of which is supplied with the reference potential Vbb1. Then, a load resistor R10 and a transistor Q24 serving as a constant current source are connected to their emitters connected in common, and the predetermined reference potential is supplied to one terminal of the load resistor R10. A base of the transistor Q24 is supplied with a reference potential Vcs1. One terminals of the load resistors R1, R1' are connected respectively to the base of the charge bipolar transistor QU and to a base of a charge bipolar transistor QU'. The other terminals of the load resistors R1, R1' are connected to the collectors of the transistors QU, QU' that are connected in common, and the reference potential defined as the ground potential is supplied thereto. Further, one terminals of the load resistor R2 and of a load resistor R2' are connected to a collector of a transistor Q25 a base of which is supplied with the input A1, and to a collector of a transistor Q26 a base of which is supplied with the reference potential Vbb1. A load resistor R11 and a transistor Q27 serving as a constant current source are connected to their emitters connected in common, and the predetermined reference potential is supplied to one terminal of the load resistor R11. The reference potential Vcs1 is supplied to a base of the transistor Q27. One terminals of the load resistor R2 and of a load resistor R2' are connected respectively to the base of the discharge bipolar transistor QD and to a base of a discharge bipolar transistor QD'. The other terminals of the load resistor R2 and of the load resistor R2' are connected to the emitter of the charge bipolar transistor QU and to an emitter of the charge bipolar transistor QU'.

The emitter of the transistor QU is connected to the collector of the discharge NPN bipolar transistor QD, and the output YN is taken out. The base of the transistor QD is connected to a connecting node between the collector of the transistor Q26 and one terminal of the load resistor R2. Then, the emitter of the transistor QD is connected to one terminal of the load resistor R3, and the collectors of the transistors Q7, Q8. The base of the transistor Q7 is connected to the emitter of the transistor Q8 and to one terminal of the load resistor R4, and the base of the transistor Q8 is connected to the other terminal of the load resistor R3 and to the collector of the transistor Q9 constituting the constant current source IAPD. The predetermined reference potential is supplied to the emitter of the transistor Q7, the other terminal of the load resistor R4 and the emitter of the transistor Q9. The transistor QAPD in FIG. 1 is constructed of a circuit based on the Darlington construction, which circuit consists of the transistors Q7, Q8 and the load resistor R4. Further, the capacitor CF for giving a much higher speed to the switching operation, is connected between the base of the discharge NPN bipolar transistor QD and the other terminal of the load resistor R3. Connected also to the base of the transistor Q9 is the bias circuit for generating such a voltage as to always make constant the currents flowing across the transistors Q7, U8.

The emitter of the transistor QU' is connected to the collector of the discharge NPN bipolar transistor QD', and, on the other hand, the output Y is taken out. The base of the transistor QD' is connected to a connecting node between the collector of the transistor Q25 and one terminal of the load resistor R2', and the emitter of the transistor QD' is connected to one terminal of the load resistor R3' and to the collectors of the transistors Q7', Q8'. The base of the transistor Q7' is connected to the emitter of the transistor Q8' and to one terminal of the load resistor R4', and the base of the transistor Q8' is connected to the other terminal of the load resistor R3' and to the collector of the transistor Q9' constituting the constant current source IAPD. The predetermined reference potential is supplied to the emitter of the transistor Q7', the other terminal of the load resistor R4' and the emitter of the transistor Q9'. The transistor QAPD in FIG. 1 is constructed of a circuit based on the Darlington construction, which circuit consists of the transistors Q7',Q8' and the load resistor R4'. Further, a capacitor CF' for giving a much higher speed to the switching operation, is connected between the base of the discharge NPN bipolar transistor QD' and the other terminal of the load resistor R3'. Connected also to the base of the transistor Q9' is a bias circuit for generating such a voltage as to always make constant the currents flowing across the transistors Q7', Q8'.

In the construction of the differential output circuit in accordance with the fifth embodiment, a construction of a Y/YN active pull-down output portion for obtaining the differential outputs Y, YN is substantially the same as the construction of the 3-input NOR logic circuit in the third embodiment in FIG. 3. A different construction is, however, that the bases of the transistors QU, QU' are controlled by an output of one differential amplifier consisting of the transistors Q22, Q23 and the load resistors R1, R1', and the bases of the transistors QD, QD' are controlled by an output of the other differential amplifier consisting of the transistors Q25, Q26 and the load resistors R2, R2'. The basic operating principle is the same as the operating principle discussed in the first through third embodiments in FIGS. 1 to 3.

Figure 10:
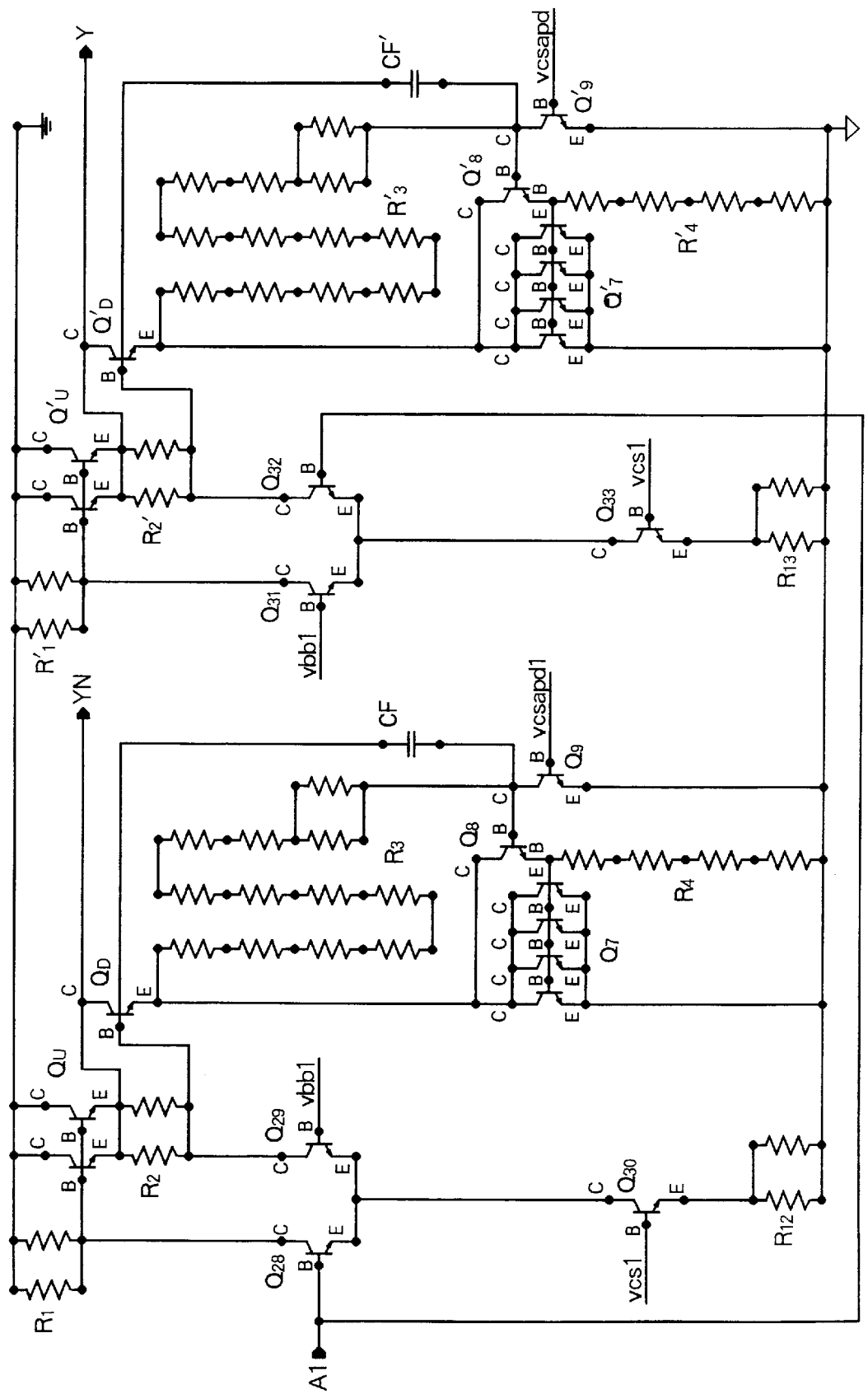
FIG. 10 is a circuit diagram showing a construction of the logic circuit in a sixth embodiment of the present invention.

FIG. 10 is a circuit diagram of a construction of the logic circuit in accordance with a sixth embodiment of the present invention, illustrating a second case where the logic circuit of the present invention is applied to a differential output circuit.

One terminals of the load resistors R1, R2 are connected to collectors of a transistor Q28 a base of which is supplied with the input A1, and of a transistor Q29 a base of which is supplied with the reference potential Vbb1. Then, a load resistor R12 and a transistor Q30 serving as a constant current source are connected to their emitters connected in common, and the predetermined reference potential is supplied to one terminal of the load resistor R12. A base of the transistor Q30 is supplied with the reference potential Vcs1. One terminals of the load resistors R1, R2 are connected respectively to the base of the charge bipolar transistor QU and to the base of the discharge bipolar transistor QD, and the other terminal of the load resistors R1 is connected to the collector of the transistor QU and is supplied with the reference potential serving as the ground potential. Then, the other terminal of the load resistor R2 is connected to the emitter of the transistor QU. A connecting node between the emitter of the transistor QU and the load resistor R2 is connected to the collector of the transistor QD, and the output YN is taken out.

The emitter of the transistor QD is connected to one terminal of the load resistor R3 and to the collectors of the transistors Q7, Q8. The base of the transistor Q7 is connected to the emitter of the transistor Q8 and to one terminal of the load resistor R4, and the base of the transistor Q8 is connected to the other terminal of the load resistor R3 and to the collector of the transistor Q9 constituting the constant current source IAPD. The predetermined reference potential is supplied to the emitter of the transistor Q7, the other terminal of the load resistor R4 and the emitter of the transistor Q9. The transistor QAPD in FIG. 1 is constructed of the circuit based on the Darlington construction, which circuit consists of the transistors Q7, Q8 and the load resistor R4. Further, the capacitor CF for giving a much higher speed to the switching operation, is connected between the base of the discharge NPN bipolar transistor QD and the other terminal of the load resistor R3. Connected also to the base of the transistor Q9 is the bias circuit for generating such a voltage as to always make constant the currents flowing across the transistors Q7, Q8.

One terminals of the load resistor R1' and a load resistor R2' are connected to collectors of a transistor Q32 a base of which is supplied with the input A1, and of a transistor Q31 a base of which is supplied with the reference potential Vbb1. Then, a load resistor R13 and a transistor Q33 serving as a constant current source are connected to their emitters connected in common, and the predetermined reference potential is supplied to one terminal of the load resistor R13. A base of the transistor Q33 is supplied with a reference potential Vcs1. One terminals of the load resistors R1', R2' are connected respectively to the base of the charge bipolar transistor QU' and to a base of a discharge bipolar transistor QD'. The other terminal of the load resistor R1' is connected to the collector of the transistor QU' and is supplied with the reference potential serving as the ground potential, and the other terminal of the load resistor R2' is connected to the emitter of the transistor QU'. A connecting node between the emitter of the transistor QU' and the load resistor R2' is connected to the collector of the transistor QD', and the output Y is taken out.

The emitter of the transistor QD' is connected to one terminal of the load resistor R3' and to the collectors of the transistors Q7', Q8'. The base of the transistor Q7' is connected to the emitter of the transistor Q8' and to one terminal of the load resistor R4', and the base of the transistor Q8' is connected to the other terminal of the load resistor R3' and to the collector of the transistor Q9' constituting the constant current source IAPD. The predetermined reference potential is supplied to the emitter of the transistor Q7', the other terminal of the load resistor R4' and the emitter of the transistor Q9'. The transistor QAPD in FIG. 1 is constructed of a circuit based on the Darlington construction, which circuit consists of the transistors Q7', Q8' and the load resistor R4'. Further, a capacitor CF' for giving a much higher speed to the switching operation, is connected between the base of the discharge NPN bipolar transistor QD' and the other terminal of the load resistor R3'. Connected also to the base of the transistor Q9' is a bias circuit for generating such a voltage as to always make constant the currents flowing across the transistors Q7', Q8'.

In the construction of the differential output circuit in the sixth embodiment of the present invention, two sets of the 3-input NOR logic circuits in the third embodiment in FIG. 3 are arranged and connected in parallel. The basic operating principle is the same as the operating principle explained in the first through third embodiments shown in FIGS. 1 to 3.

Figure 11:
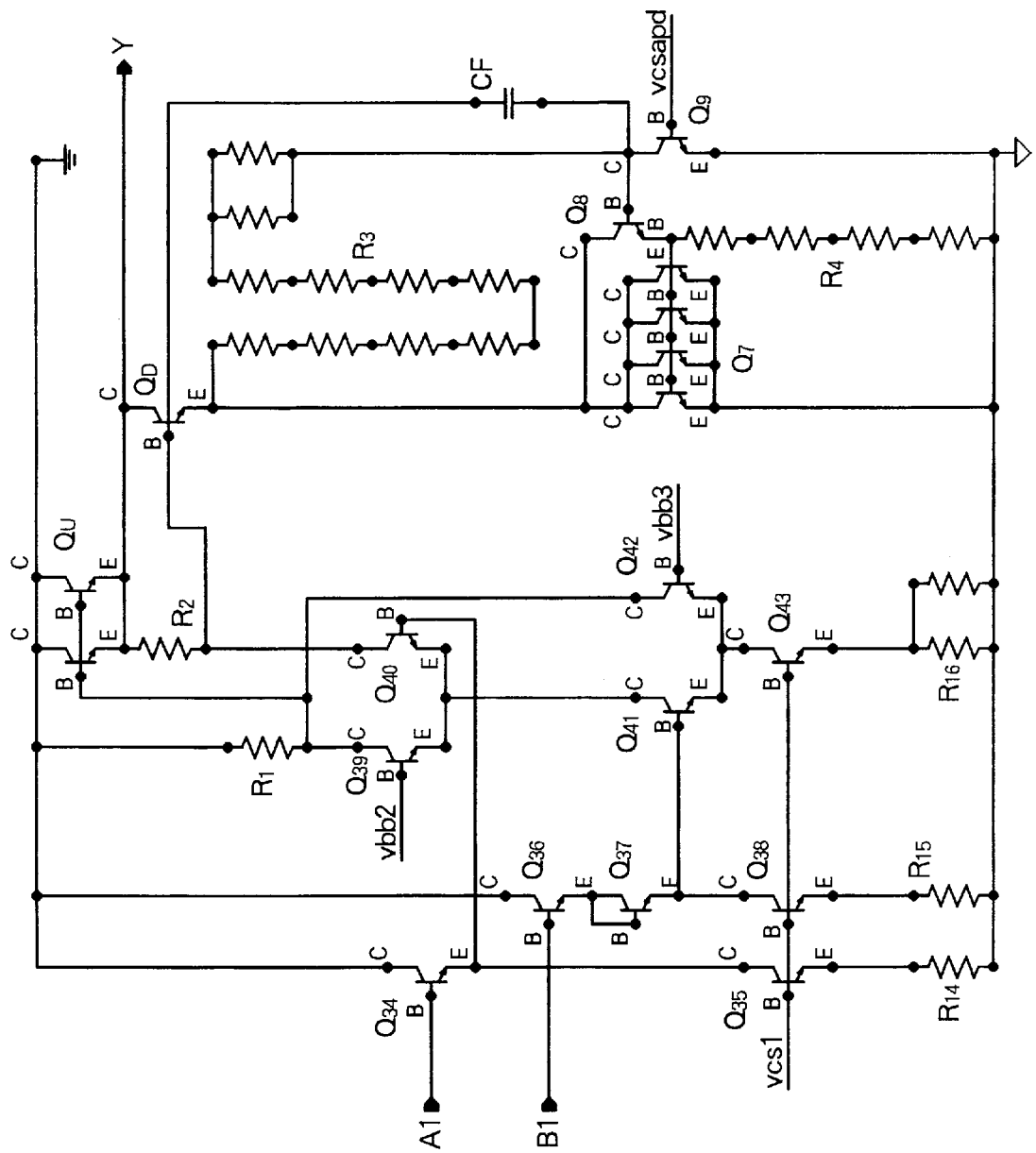
FIG. 11 is a circuit diagram showing a construction of the logic circuit in a seventh embodiment of the present invention.

FIG. 11 is a circuit diagram of a construction of the logic circuit in accordance with a seventh embodiment of the present invention, showing a case where the logic circuit of the present invention is applied to a 2-input AND logic circuit.

The reference potential as the ground potential is given to a collector of a transistor Q34 a base of which is supplied with the input A1, and an emitter of the transistor Q34 is connected to a load resistor R14 and a transistor Q35 serving as a constant current source A predetermined reference potential is supplied to one terminal of the load resistor R14. The reference potential as the ground potential is given to a collector of a transistor Q36 a base of which is supplied with the input B1, and an emitter of the transistor Q36 is connected to a base and a collector of a transistor Q37. A load resistor R15 and a transistor Q38 serving as a constant current source are connected to the emitter of the transistor Q37. The predetermined reference potential is supplied to one terminal of the load resistor R15.

One terminals of the load resistors R1, R2 are connected to collectors of a transistor Q39 a base of which is supplied with a reference potential Vbb2, and of a transistor Q40 a base of which the emitter of the transistor Q34 is connected to. A collector of a transistor Q41 is connected to the emitters, connected in common, of the transistors Q39, Q40, and a base of the transistor Q41 is connected to a connecting node between the emitter of the transistor Q37 and the collector of the transistor Q38. Further, a collector of a transistor Q42 is connected to a connecting node between the collector of the transistor Q39 and one terminal of the load resistor R1, and a reference potential Vbb3 is supplied to a base of the transistor Q42. A load resistor R16 and a transistor Q43 serving as a constant current source are connected to the emitters, connected in common, of the transistors Q41, Q42. The predetermined reference potential is supplied to one terminal of the load resistor R16. The other terminal of the load resistors R1 is connected to the collector of the transistor QU and is supplied with the reference potential serving as the ground potential. The base of the transistor QU is connected to a connecting node between the collector of the transistor Q39 and one terminal of the load resistor R1, and the other terminal of the load resistor R2 is connected to the emitter of the transistor QU.

The emitter of the transistor QU is connected to the collector of the discharge NPN bipolar transistor QD, and, on the other hand, the output Y is taken out. The base of the transistor QD is connected to a connecting node between the collector of the transistor Q40 and one terminal of the load resistor R2, and the emitter of the transistor QD is connected to one terminal of the load resistor R3, and the collectors of the transistors Q7, Q8. The base of the transistor Q7 is connected to the emitter of the transistor Q8 and to one terminal of the load resistor R4, and the base of the transistor Q8 is connected to the other terminal of the load resistor R3 and to the collector of the transistor Q9 constituting the constant current source IAPD. The predetermined reference potential is supplied to the emitter of the transistor Q7, the other terminal of the load resistor R4 and the emitter of the transistor Q9. The transistor QAPD in FIG. 1 is constructed of the circuit based on the Darlington construction, which circuit consists of the transistors Q7, Q8 and the load resistor R4. Further, the capacitor CF for giving a much higher speed to the switching operation, is connected between the base of the discharge NPN bipolar transistor QD and the other terminal of the load resistor R3. Connected also to the base of the transistor Q9 is the bias circuit for generating such a voltage as to always make constant the currents flowing across the transistors Q7, Q8.

According to the construction of the 2-input AND logic circuit in the seventh embodiment of the present invention, the transistors Q39, Q40, Q41, Q42, and the load resistors R1, R2 serve as the differential amplifier constituting the 2-input AND logic circuit, while the transistors Q34, Q36, Q37 serve as an emitter follower circuit for a level shift. Other configurations are the same as those in the construction of the 3-input NOR logic circuit in the third embodiment in FIG. 3, and the basic operating principle is the same as the operating principle explained in the first through third embodiments in FIGS. 1 to 3.

Figure 12A:
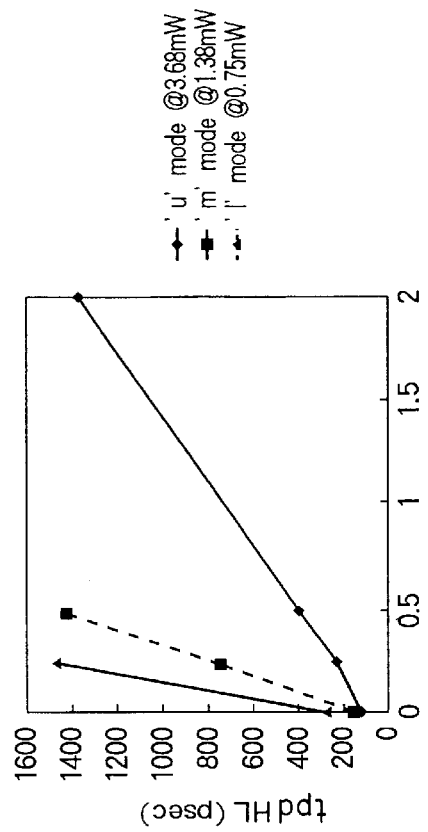
FIGS. 12A–12D are graphs each illustrating a load capacitance dependency of a propagation delay time of each of a 3-input NOR logic circuit in the third embodiment of the present invention in FIG. 3 and a prior art 3-input NOR logic circuit in FIG. 13.
Figure 12B:
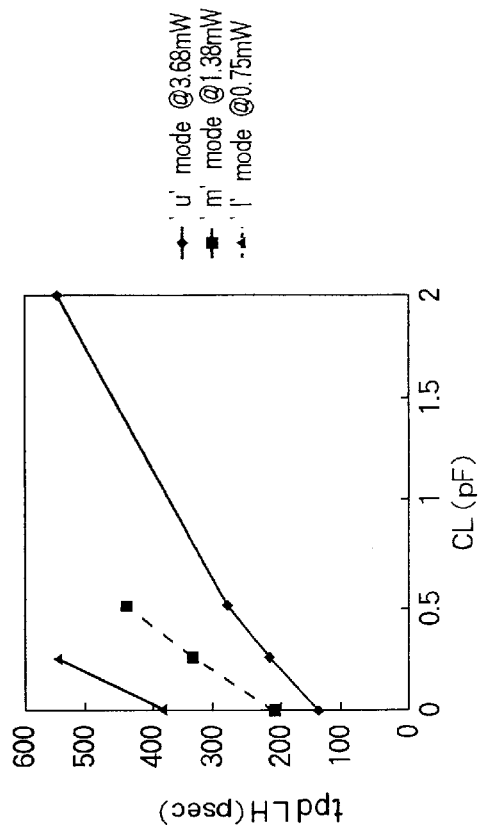
Figure 12C:
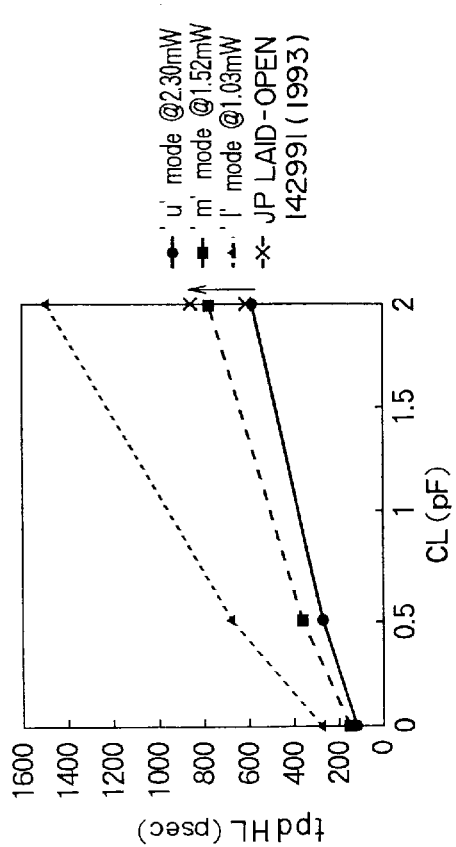
Figure 12D:
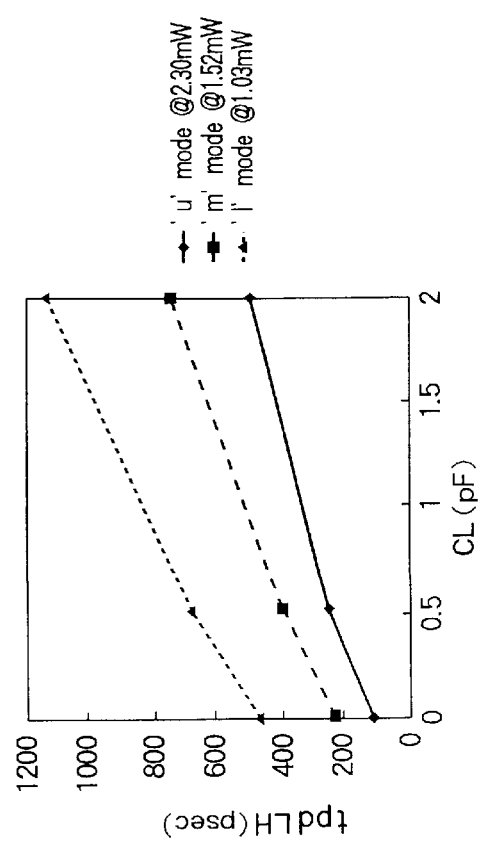
Figure 13:
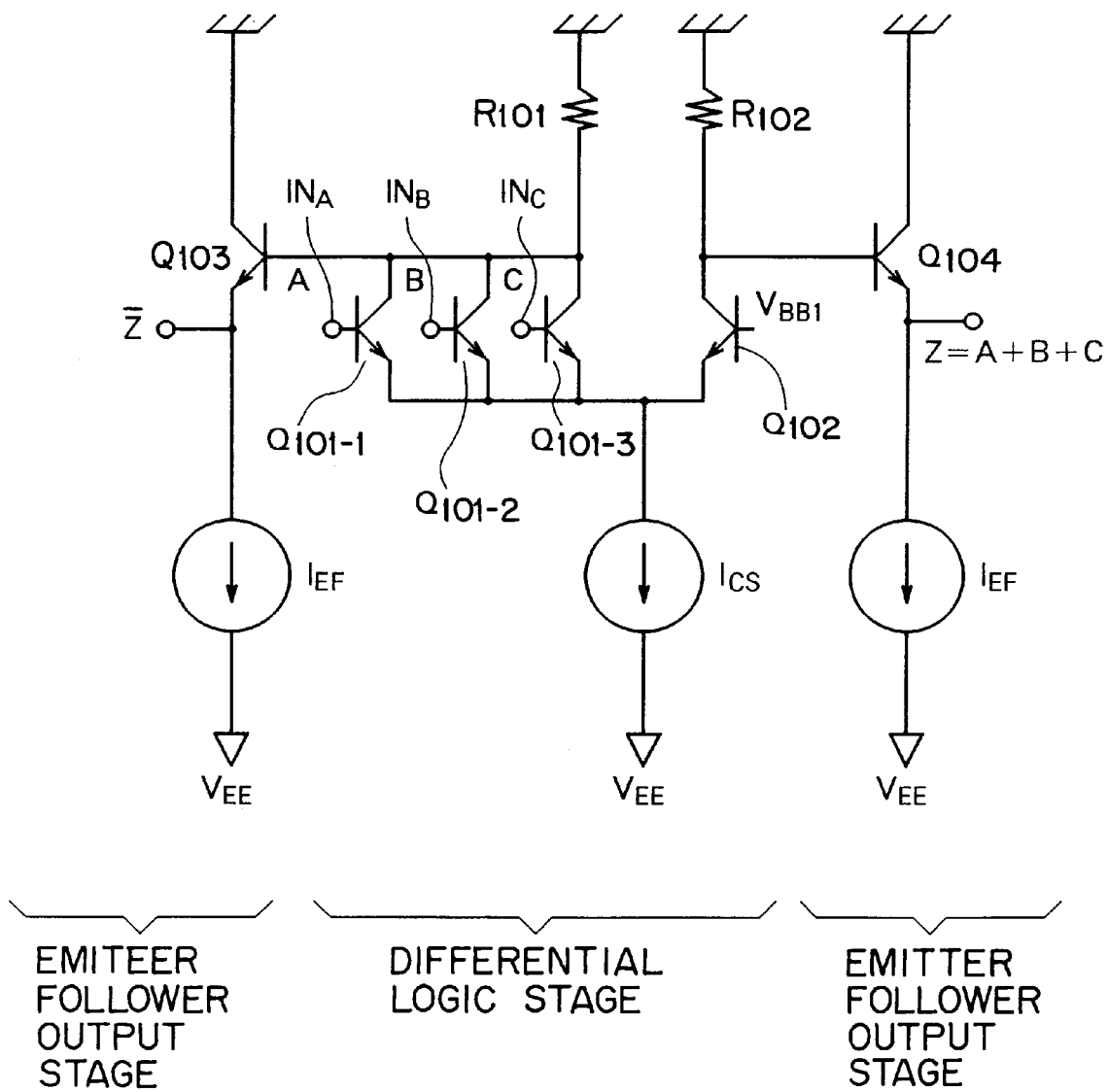
FIG. 13 is a circuit diagram illustrating a construction of a prior art ECL circuit.

FIGS. 12A–12D are graphs showing a load capacitance dependency of the propagation delay time in the 3-input NOR logic circuit in the third embodiment in FIG. 3 as well as in the conventional 3-input NOR logic circuit in FIG. 13. FIGS. 12A and 12B show the load capacitance dependency of the fall propagation delay time and of the rise propagation delay time of the 3-input NOR logic circuit in the third embodiment of the present invention. FIGS. 12C and 12D shows the load capacitance dependency of the fall propagation delay time and the rise propagation delay time of the conventional 3-input NOR logic circuit. Further, for a comparative contrast, FIG. 12A also shows the fall propagation delay time of a second conventional ECL circuit (shown in FIG. 4 of Japanese Patent Laid-Open Publication No.7-142991) in FIG. 14.

With respect to the 3-input NOR logic circuit in the third embodiment of the present invention, the conditions are set so that the consumption electric power per unit of one construction of the circuit becomes 2.30 mW, 1.52 mW and 1.03 mW, and there is performed a test for the load capacitance dependency of the fall propagation delay time and the rise propagation delay time. Further, with respect to the conventional 3-input NOR logic circuit, the consumption electric power per unit of one construction of the circuit becomes 3.68 mW, 1.38 mW and 0.75 mW, and there is performed the test for the fall propagation delay time and the rise propagation delay time.

It can be understood from the graph of FIG. 12 that the load capacitance dependency of the fall propagation delay is by far more improved in the 3-input NOR logic circuit in the third embodiment of the present invention without deteriorating the load capacitance dependency of the rise propagation delay time than in the conventional 3-input NOR logic circuit.

In a comparison in terms of a power delay product, when the load capacitance CL=2 pF, the 3-input NOR logic circuit in the third embodiment of the present invention shows approximately 1.5 pJ, while the conventional 3-input NOR logic circuit indicates approximately 5 pJ or larger, and therefore the former load capacity is reduced by a factor of approximately 3 or under.

Figure 14:
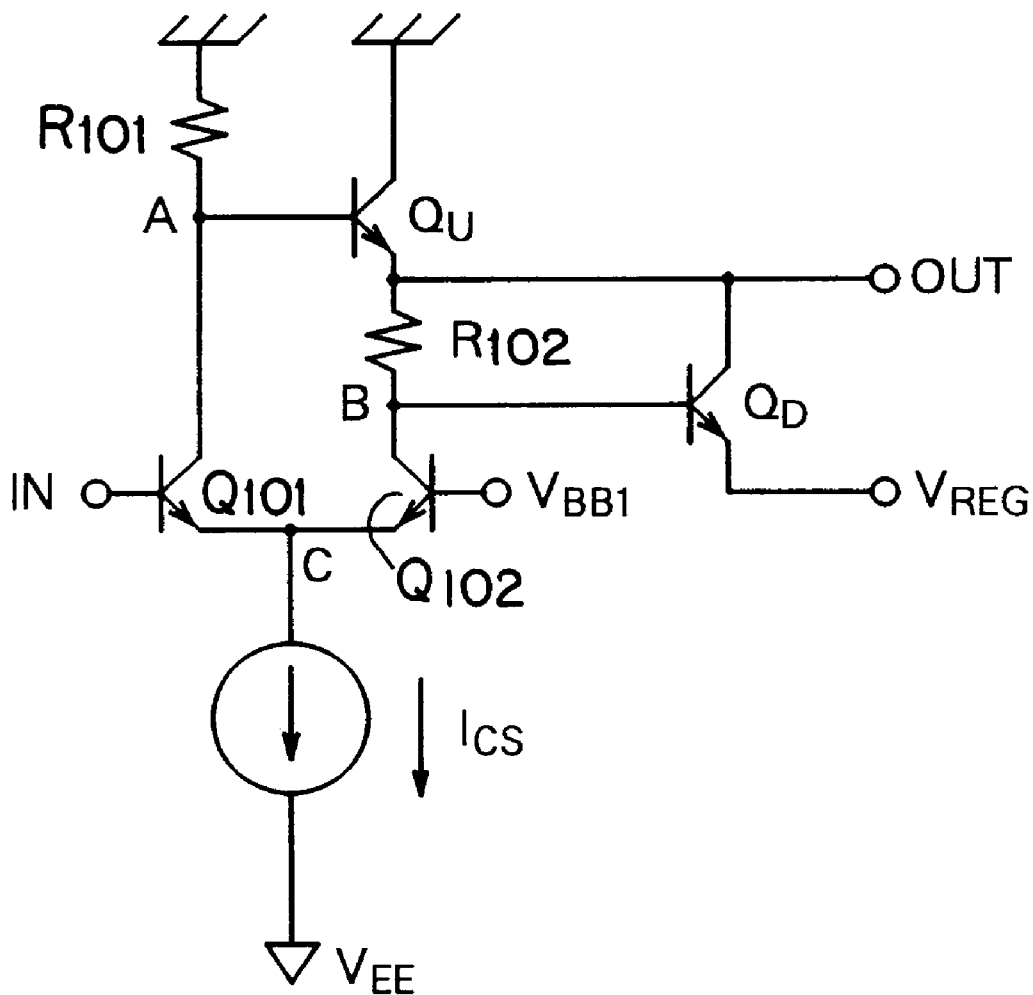
FIG. 14 is a circuit diagram showing a construction of the prior art ECL circuit.
Figure 15:
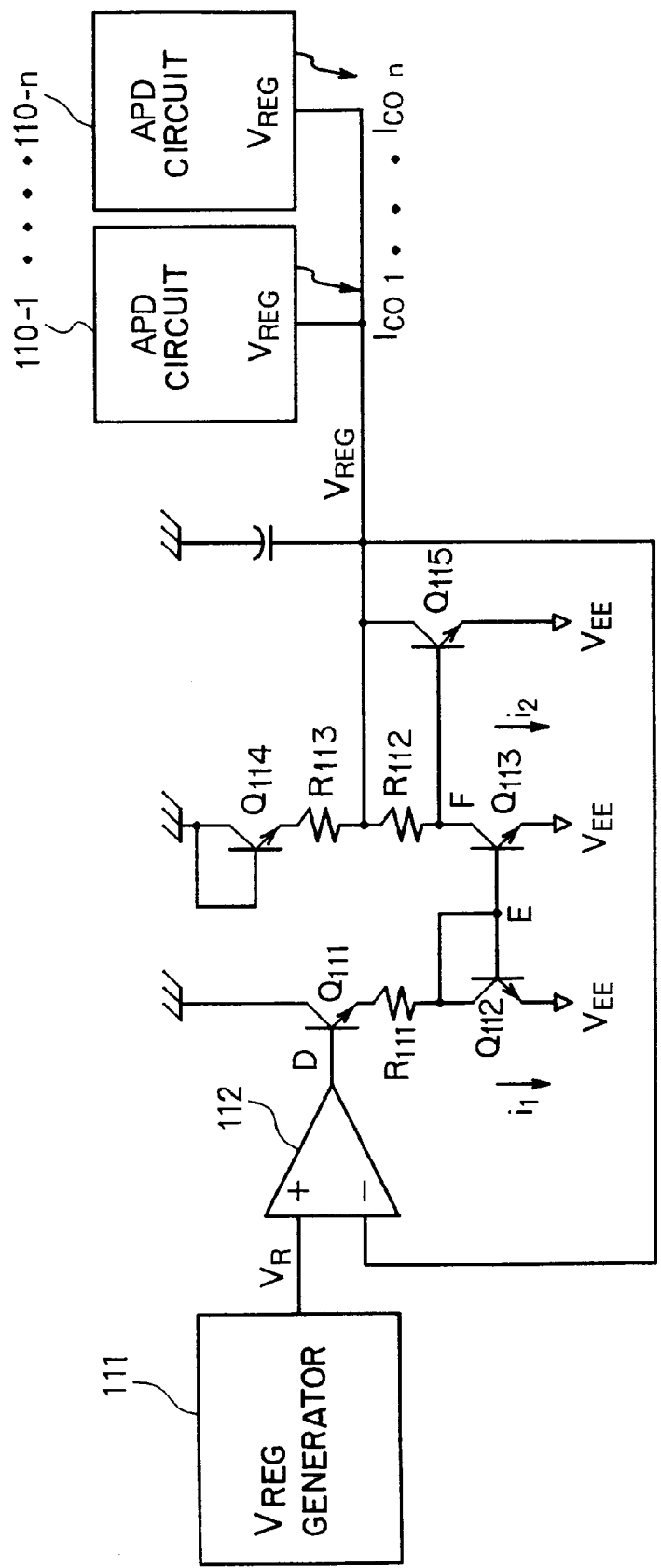
FIG. 15 is a circuit diagram showing a construction of a second ECL circuit in FIG. 14 when actually used.
Figure 16:
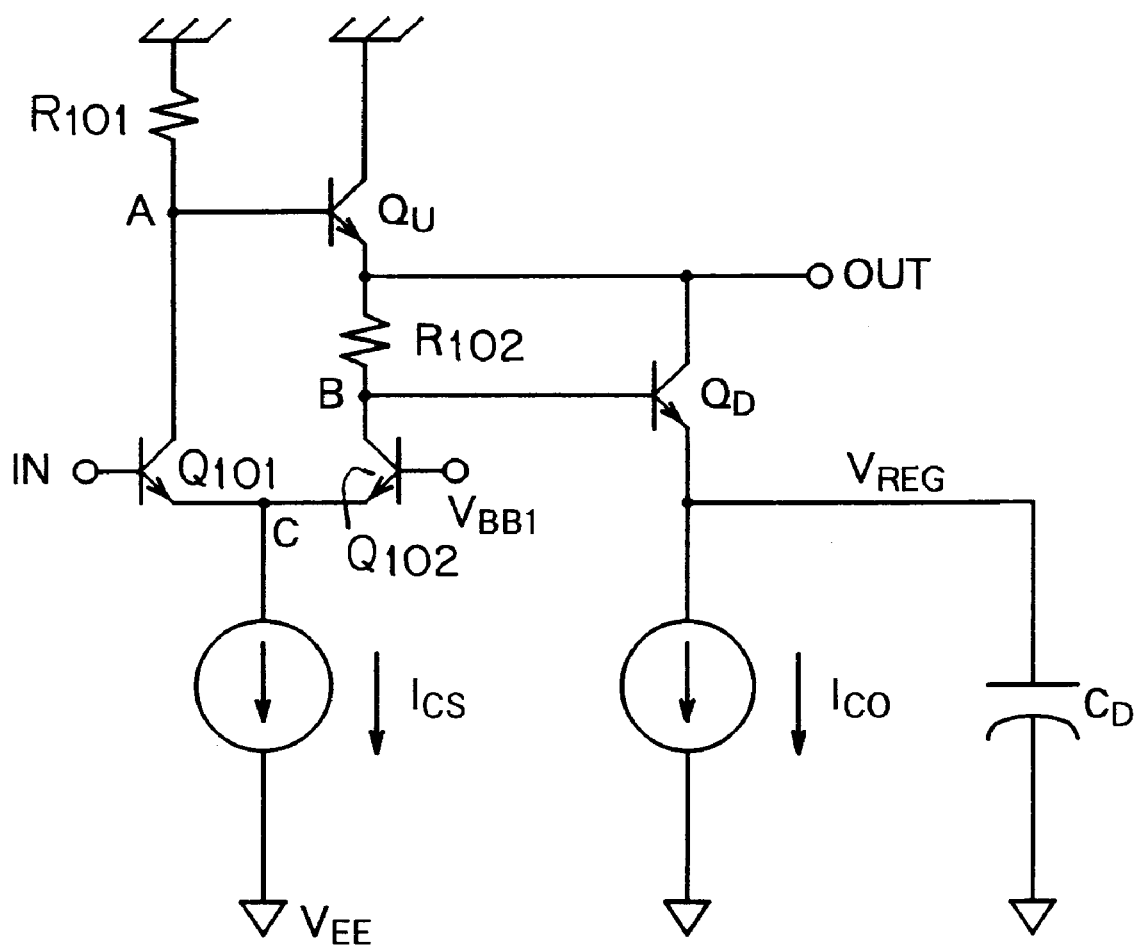
FIG. 16 is a circuit diagram showing a construction of a third prior art ECL circuit.

Further, as shown in FIG. 12A, if twenty pieces of cells of the circuit in which the load capacitance on the order of 2 pF is added to the conventional second ECL circuit in FIG. 14, are simultaneously switched by connecting these cells to a constant potential generating circuit as illustrated in FIG. 15, the fall propagation delay time is worsened approximately 1.4 times from about 600 ps to about 850 ps as compared with the case of a single cell. In contrast, according t the 3-input NOR logic circuit in the third embodiment of the present invention, even when thirty pieces of cells are connected to a Vcsapd line, the fluctuation in the propagation delay time is as small as 10 ps (approximately several %).

What is claimed is:

1. A logic circuit comprising:

a differential logic circuit including first and second differential current output nodes for outputting first and second differential current outputs complementary to each other in accordance with one or more input signals;

a first load resistor having one terminal connected to said first differential current output node, and the other terminal connected to a first power supply for supplying a first reference potential;

a second load resistor, one terminal of which being connected to said second differential current output node;

a first NPN transistor having a base connected to one terminal of said first load resistor, a collector connected to said first power supply, and an emitter connected to the other terminal of said second load resistor;

a second NPN transistor having a base connected to one terminal of said second load resistor, and a collector connected to a connecting node between the other terminal of said second load resistor and the emitter of said first NPN transistor;

a third load resistor, one terminal of which being connected to the emitter of said second NPN transistor;

a constant current source having its positive pole side connected to the other terminal of said third load resistor, and its negative pole side connected to a second power supply for supplying a second reference potential;

a third NPN transistor having a base connected to a connecting node between the other terminal of said third load resistor and said constant current source, a collector connected to a connecting node between the emitter of said second NPN transistor and one terminal of said third load resistor, and an emitter connected to said second power supply;

an output node for outputting an output signal from a common connecting node of the emitter of said first NPN transistor, the other terminal of said second load resistor and the collector of said second NPN transistor; and a capacitor having one side connected to a connecting node between said second differential current output node, one terminal of said second load resistor and the base of said second NPN transistor, and the other side connected to a connecting node between the other terminal of said third load resistor and the positive pole side of said constant current source.

2. The logic circuit according to claim 1, wherein said third NPN transistor is a Darlington amplifier composed of two transistors which are connected in Darlington connection.

3. The logic circuit according to claim 1, wherein said constant current source is an NPN transistor having a base to which an output node of a bias circuit is connected, and an output of said bias circuit has a value set so that a collector current of said third NPN transistor is kept constant at all times in a static state exclusive of a transient state on the occasion of a switching operation.

4. The logic circuit according to claim 1, wherein said differential logic circuit further comprises:

fourth, fifth and sixth NPN transistors with collectors connected in common to be used as said first differential current output node, with bases to which first, second and third input signals are respectively supplied, and with emitters connected in common;

a seventh NPN transistor with a base connected to a third power supply for supplying a third reference potential, with a collector serving as said second differential current output node, and with an emitter connected to the emitters, connected in common, of said fourth, fifth and sixth NPN transistors;

an eighth NPN transistor with a base connected to a fourth power supply for supplying a fourth reference potential, and with a collector connected to the emitters of said fourth, fifth, sixth and seventh NPN transistors; and a fourth load resistor having one terminal connected to the emitter of said eighth NPN transistor, and the other terminal connected to said second power supply.

5. The logic circuit according to claim 1, wherein said differential logic circuit includes:

fourth, fifth and sixth NPN transistors with collectors connected respectively to said first power supply, with bases to which first, second and third input signals are respectively supplied, and with emitters connected in common;

a seventh NPN transistor with a base connected to a third power supply for supplying a third reference potential, and with a collector connected to the emitters, connected in common, of said fourth, fifth and sixth NPN transistors;

a fourth load resistor having one terminal connected to the emitter of said seventh NPN transistor, and the other terminal connected to said second power supply;

an eighth NPN transistor with a base connected to a fourth power supply for supplying a fourth reference potential, and with a collector serving as said first differential current output node;

a ninth NPN transistor with a base connected to the emitters, connected in common, of said fourth, fifth and sixth NPN transistors, with a collector serving as said second differential current output node, and with an emitter connected in common to the emitter of said eighth NPN transistor;

a tenth NPN transistor with a base connected to said third power supply, with a collector connected to the emitters, connected in common, of said eighth and ninth NPN transistors; and a fifth load resistor having one terminal connected to the emitter of said tenth NPN transistor, and the other terminal connected to said second power supply.

6. The logic circuit according to claim 1, wherein said differential logic circuit includes:

a fourth NPN transistor having a base to which a first input signal is supplied, and a collector connected to said first power supply;

a fifth NPN transistor having a base connected to a third power supply for supplying a third reference potential, and a collector connected to the emitter of said fourth NPN transistor;

a fourth load resistor having one terminal connected to the emitter of said fifth NPN transistor, and the other terminal connected to said second power supply;

a sixth NPN transistor having a base to which a second input signal is supplied, and a collector connected to said first power supply;

a seventh NPN transistor having a base and a collector connected to the emitter of said sixth NPN transistor;

an eighth NPN transistor having a base connected to a third power supply, and a collector connected to the emitter of said seventh NPN transistor;

a fifth load resistor having one terminal connected to the emitter of said eighth NPN transistor, and the other terminal connected to said second power supply;

a ninth NPN transistor having a base connected to a fourth power supply for supplying a fourth reference potential, and a collector serving as said first differential current output node;

a tenth NPN transistor having a base connected to the emitter of said fourth NPN transistor, a collector serving as said second differential current output node, and an emitter connected in common to the emitter of said ninth NPN transistor;

an eleventh NPN transistor having a base connected to the emitter of said seventh NPN transistor, and a collector connected to the emitters, connected in common, of said ninth and tenth NPN transistors;

a twelfth NPN transistor having a base connected to a fifth power supply for supplying a fifth reference potential, a collector connected to the collector of said ninth NPN transistor, and an emitter connected in common to the emitter of said eleventh NPN transistor;

a thirteenth NPN transistor having a base connected to said third power supply, and a collector connected to the emitters, connected in common, of said eleventh and twelfth NPN transistors; and a sixth load resistor having one terminal connected to the emitter of said thirteenth NPN transistor, and the other terminal connected to said second power supply.

7. A logic circuit comprising:

a first NPN transistor having a base for receiving a first input signal;

a second NPN transistor having a base connected to a first power supply for supplying a first reference potential, and an emitter connected to an emitter of said first NPN transistor;

a third NPN transistor having a base connected to a second power supply for supplying a second reference potential, and a collector connected to a common connecting node between the emitters of said first and second NPN transistors;

a first load resistor having one terminal connected to the emitter of said third NPN transistor, and the other terminal connected to a third power supply for supplying a third reference potential;

a fourth NPN transistor having a base for receiving the first input signal;

a fifth NPN transistor having a base connected to the first power supply, and an emitter connected to the emitter of said fourth NPN transistor;

a sixth NPN transistor having a base connected to the second power supply, and a collector connected to a common connecting node between the emitters of said fourth and fifth NPN transistors;

a second load resistor having one terminal connected to the emitter of said sixth NPN transistor, and the other terminal connected to said third power supply;

a third load resistor having one terminal connected to the collector of said first NPN transistor, and the other terminal connected to a fourth power supply for supplying a fourth reference potential;

a fourth load resistor, one terminal thereof being connected to a collector of said fifth NPN transistor;

a seventh NPN transistor having a base connected to the one terminal of said third load resistor, a collector connected to the other terminal of said third load resistor, and an emitter connected to the other terminal of said fourth load resistor;

an eighth NPN transistor having a base connected to the one terminal of said fourth load resistor, and a collector connected to a connecting node between the other terminal of said fourth load resistor and the emitter of said seventh NPN transistor;

a fifth load resistor, one terminal of which being connected to the emitter of said eighth NPN transistor;

a first constant current source having its positive pole side connected to the other terminal of said fifth load resistor, and its negative pole side connected to said third power supply;

a ninth NPN transistor having a base connected to a connecting node between the other terminal of said fifth load resistor and said first constant current source, a collector connected to a connecting node between the emitter of said eighth NPN transistor and the one terminal of said fifth load resistor, and an emitter connected to said third power supply;

a first output node for outputting a first output signal from a common connecting node of the emitter of said seventh NPN transistor, the other terminal of said fourth load resistor and the collector of said eighth NPN transistor;

a sixth load resistor having one terminal connected to the collector of said second NPN transistor, and the other terminal connected to said fourth power supply;

a seventh load resistor, one terminal thereof being connected to the collector of said fourth NPN transistor;

a tenth NPN transistor having a base connected to the one terminal of said sixth load resistor, a collector connected to the other terminal of said sixth load resistor, and an emitter connected to the other terminal of said seventh load resistor, an eleventh NPN transistor having a collector connected to a connecting node between the other terminal of said seventh load resistor and the emitter of said tenth NPN transistor;

an eighth load resistor having one terminal connected to the emitter of said eleventh NPN transistor, a second constant current source having its positive pole side connected to the other terminal of said eighth load resistor, and its negative pole side connected to said third power supply;

a twelfth NPN transistor having a base connected to a connecting node between the other terminal of said eighth load resistor and said second constant current source, a collector connected to a connecting node between the emitter of said eleventh NPN transistor and the one terminal of said eighth load resistor, and an emitter connected to said third power supply; and a second output node for outputting a second output signal from a common connecting node of the emitter of said tenth NPN transistor, the other terminal of said seventh load resistor and the collector of said eleventh NPN transistor.

8. The logic circuit according to claim 7, wherein said ninth and twelfth NPN transistors are Darlington amplifiers each composed of two transistors which are connected in Darlington connection.

9. The logic circuit according to claim 7, wherein said first and second constant current sources are NPN transistors each having a base to which an output node of a bias circuit is connected, and an output of said bias circuit has a value set so that collector currents of said ninth and twelfth NPN transistors are respectively kept constant at all times in a static state exclusive of a transient state on the occasion of a switching operation.

10. The logic circuit according to claim 7, further comprising:

a first capacitor having one terminal connected to a connecting node between the collector of said fifth NPN transistor, the one terminal of said fourth resistor and the base of said eighth NPN transistor, and the other terminal connected to a connecting node between the other terminal of said fifth load resistor and the positive pole side of said first constant current source; and a second capacitor having one terminal connected to a connecting node between the collector of said fourth NPN transistor and the base of said eleventh NPN transistor, and the other terminal connected to a connecting node between the other terminal of said eighth load resistor and the positive pole side of said second constant current source.

11. A logic circuit comprising:

a first NPN transistor having a base for receiving a first input signal;

a second NPN transistor having a base connected to a first power supply for supplying a first reference potential, and an emitter connected to an emitter of said first NPN transistor;

a third NPN transistor having a base connected to a second power supply for supplying a second reference potential, and a collector connected to a common connecting node between the emitters of said first and second NPN transistors;

a first load resistor having one terminal connected to the emitter of said third NPN transistor, and the other terminal connected to a third power supply for supplying a third reference potential;

a second load resistor having one terminal connected to the collector of said first NPN transistor, and the other terminal connected to a fourth power supply for supplying a fourth reference potential;

a third load resistor, a one terminal thereof being connected to the collector of said second NPN transistor;

a fourth NPN transistor having a base connected to said one terminal of said second load resistor, a collector connected to the other terminal of said second load resistor and an emitter connected to the other terminal of said third load resistor;

a fifth NPN transistor having a base connected to the one terminal of said third load resistor, a collector connected to a connection node between the other terminal of the third load resistor and the emitter of said fourth NPN transistor;

a fourth load resistor, a one terminal thereof being connected to the emitter of said fifth NPN transistor;

a first constant current source having its positive pole side connected to the other terminal of said fourth load resistor, and its negative pole side connected to said third power supply;

a sixth NPN transistor having a base connected to a connecting node between the other terminal of said fourth load resistor and said first constant current source, a collector connected to a connecting node between the emitter of said fifth NPN transistor and the one terminal of said fourth load resistor, and an emitter connected to said third power supply;

a first output node for outputting a first output signal from a common connecting node between the emitter of said fourth NPN transistor and the other terminal of the third load resistor;

a seventh NPN transistor having a base connected to the first power supply;

an eighth NPN transistor having a base for receiving said first input signal and an emitter connected to the emitter of said seventh NPN transistor;

a ninth NPN transistor having a base connected to said second power supply and a collector connected to emitters of said seventh and eighth NPN transistor;

a fifth load resistor having a one terminal connected to the emitter of said ninth NPN transistor and an other terminal connected to said third power supply;

a sixth load resistor having a one terminal connected to the collector of said seventh NPN transistor, and an other terminal connected to said fourth power supply;

a seventh load resistor, one terminal thereof being connected to the collector of said eighth NPN transistor;

a tenth NPN transistor having a base connected to the one terminal of said sixth load resistor, a collector connected to the other terminal of said sixth load resistor, and an emitter connected to the other terminal of said seventh load resistor;

an eleventh NPN transistor having a base connected to the one terminal of said seventh load resistor, a collector connected to a connecting node between the other terminal of said seventh load resistor and the emitter of said tenth NPN transistor;

an eighth load resistor having one terminal connected to the emitter of said eleventh NPN transistor;

a second constant current source having its positive pole side connected to the other terminal of said eighth load resistor, and its negative pole side connected to said third power supply;

a twelfth NPN transistor having a base connected to a connecting node between the other terminal of said eighth load resistor and said second constant current source, a collector connected to a connecting node between the emitter of said eleventh NPN transistor and the one terminal of said eighth load resistor, and an emitter connected to said third power supply;

a second output node for outputting a second output signal from a common connecting node of the emitter of said tenth NPN transistor, the other terminal of said seventh load resistor and the collector of said eleventh NPN transistor;

a first capacitor having one terminal connected to a connecting node between the collector of said second NPN transistor, the one terminal of said third load resistor and the base of said fifth NPN transistor, and the other terminal connected to a connecting node between the other terminal of said fourth load resistor and the positive pole side of said first constant current source; and a second capacitor having one terminal connected to a connecting node between the collector of said eighth NPN transistor and the base of said eleventh NPN transistor, and the other terminal connected to a connecting node between the other terminal of said eighth load resistor and the positive pole side of said second constant current source.

12. The logic circuit according to claim 11, wherein said sixth and twelfth NPN transistors are Darlington amplifiers each composed of two transistors which are connected in Darlington connection.

13. The logic circuit according to claim 11, wherein said first and second constant current sources are NPN transistors each having a base to which an output node of a bias circuit is connected, and an output of said bias circuit has a value set so that collector currents of said sixth and twelfth NPN transistors are respectively kept constant at all times in a static state exclusive of a transient state on the occasion of a switching operation.

* * * * *